United States Patent
Nakamura et al.

(10) Patent No.: US 8,119,930 B2
(45) Date of Patent: Feb. 21, 2012

(54) WIRING BOARD AND METHOD FOR MANUFACTURING THE SAME

(75) Inventors: Junichi Nakamura, Nagano (JP); Takaharu Miyamoto, Nagano (JP)

(73) Assignee: Shinko Electric Industries Co., Ltd., Nagano-shi, Nagano (JP)

(*) Notice: Subject to any disclaimer, the term of this patent is extended or adjusted under 35 U.S.C. 154(b) by 612 days.

(21) Appl. No.: 12/270,143

(22) Filed: Nov. 13, 2008

(65) Prior Publication Data
US 2009/0126982 A1 May 21, 2009

(30) Foreign Application Priority Data
Nov. 14, 2007 (JP) .................................. 2007-295519

(51) Int. Cl.
*H05K 1/11* (2006.01)
(52) U.S. Cl. ........................................ 174/262; 174/260
(58) Field of Classification Search ........................ None
See application file for complete search history.

(56) References Cited

U.S. PATENT DOCUMENTS
6,291,268 B1* 9/2001 Ho .................................. 438/108
2006/0273816 A1* 12/2006 Hsu .................................. 324/765

FOREIGN PATENT DOCUMENTS
JP 2000-323613 11/2000

* cited by examiner

*Primary Examiner* — Ishwarbhai Patel
(74) *Attorney, Agent, or Firm* — Drinker Biddle & Reath LLP

(57) ABSTRACT

A wiring board 10 comprises a wiring board main body 21 having a dielectric layer 25 that is the first dielectric layer, an electronic component attaching pad 24 having a connection surface 24A with which an electronic component 11 is connected, and disposed inside the dielectric layer 25, a dielectric layer 31 that is the second dielectric layer laminated on the dielectric layer 25, and the via holes 27 and 33 and a wiring pattern 28 provided on the dielectric layers 25 and 31 and electrically connected with the electronic component attaching pad 24, wherein a warp reduction member 22 for reducing a warp of the wiring board main body 21 is disposed inside the dielectric layer 25.

7 Claims, 19 Drawing Sheets

WIRING BOARD AND METHOD FOR MANUFACTURING THE SAME

BACKGROUND OF THE INVENTION

The present invention relates to a wiring board having a wiring board main body and its manufacturing method, and more particularly to a wiring board and its manufacturing method that can reduce a warp of a wiring board main body and make smaller the size of the wiring board in the thickness direction.

Conventionally, there is a wiring board called a coreless substrate in which the size of the wiring board in the thickness direction is made smaller. Since the coreless substrate does not have a core substrate, the strength is lower and the warp is more likely to occur than a build-up wiring board with a core substrate (wiring board formed with a build-up structure on both surfaces of the core substrate). There is a wiring board 200 as shown in FIG. 1 in which the warp of the coreless substrate can be reduced.

FIG. 1 is a cross-sectional view of the conventional wiring board.

Referring to FIG. 1, the conventional wiring board 200 has a wiring board main body 201 that is a coreless substrate and a stiffener 202. The wiring board main body 201 has an electronic component attaching pad 211, the dielectric layers 212 and 216, the via holes 213 and 217, a wiring pattern 215, an external connection pad 219, and a solder resist layer 221.

The electronic component attaching pad 211 has a connection surface 211A with which an electronic component 204 (e.g., semiconductor chip) is connected. The electronic component attaching pad 211 is disposed inside a dielectric layer 212 so that the connection surface 211A may be almost flush with a surface 212A of the dielectric layer 212 (surface of the dielectric layer 212 on the side where the stiffener 202 is disposed).

The dielectric layer 212 has an opening portion 225 for exposing a part of a surface 211B of the electronic component attaching pad 211 located on the opposite side of the connection surface 211A. A via hole 213 is provided in the opening portion 225. One end portion of the via hole 213 is connected with the electronic component attaching pad 211.

The wiring pattern 215 has a pad 227 and a wiring 228. The pad 227 is provided on the surface 212B of the dielectric layer 212 located on the opposite side of the surface 212A. The pad 227 is integrated with the wiring 228. The pad 227 is electrically connected via the wiring 228 with the electronic component attaching pad 211.

The wiring 228 is provided at the other end portion of the via hole 213 and on the surface 212B of the dielectric layer 212. The wiring 228 is integrated with the via hole 213 and the pad 227, as well as being connected with the electronic component attaching pad 211 and the pad 227.

The dielectric layer 216 is provided on the surface 212B of the dielectric layer 212 to cover the wiring 228. The dielectric layer 216 has an opening portion 231 for exposing a part of the pad 227. The via hole 217 is provided in the opening portion 231. One end portion of the via hole 217 is connected with the pad 227.

The external connection pad 219 is provided at the other end portion of the via hole 217 and on a surface 216A of the dielectric layer 216 (surface of the dielectric layer 216 on the opposite side of the surface in contact with the dielectric layer 212). The external connection pad 219 is integrated with the via hole 217. The external connection pad 219 has a connection surface 219A on which an external connection terminal (not shown) is disposed. The external connection pad 219 is electrically connected via the external connection terminal (not shown) disposed on the connection surface 219A with a packaging board (not shown) such as a mother board.

The solder resist layer 221 is provided on the surface 216A (surface of the dielectric layer 216 on the opposite side of the surface in contact with the dielectric layer 212) of the dielectric layer 216 to cover the connection surface 219A. The solder resist layer 221 has an opening portion 221A for exposing the connection surface 219A.

The stiffener 202 is a framework in the shape of a frame, and has a through portion 202A for receiving the electronic component 204 (exposing an area where the electronic component attaching pad 211 is formed). The stiffener 202 is bonded with the surface 212A of the dielectric layer 212 with a resin (e.g., epoxy resin) having adhesiveness. The stiffener 202 is formed by etching or punching a Cu plate or Cu alloy plate, for example. The thickness of the stiffener 202 may be 2 mm, for example.

The warp of the wiring board main body 201 that is the coreless substrate can be reduced by providing the stiffener 202 with such a constitution on the wiring board main body 201.

FIGS. 2 to 5 are views showing a manufacturing process for the conventional wiring board. In FIGS. 2 to 5, the same or like parts are designated by the same reference numerals or signs as the conventional wiring board 200 shown in FIG. 1.

Referring to FIGS. 2 to 5, a manufacturing method for the conventional wiring board 200 will be described below. At first, in the process as shown in FIG. 2, the wiring board main body 201 is formed on an upper surface 235A of a carrier 235 having conductivity such as a Cu foil or Cu plate by a well-known method. Next, in the process as shown in FIG. 3, the carrier 235 provided on a structure as shown in FIG. 2 is removed. The carrier 235 is removed by wet etching, for example.

Next, in the process as shown in FIG. 4, the stiffener 202 is formed, and then the wiring board main body 201 and the stiffener 202 are disposed oppositely so that the dielectric layer 212 provided on the wiring board main body 201 and the stiffener 202 may be confronted. The stiffener 202 is formed by etching or punching the Cu plate or Cu alloy plate, for example. The thickness of the stiffener 202 may be 2 mm, for example.

Then, in the process as shown in FIG. 5, the stiffener 202 is bonded with the wiring board main body 201 by the resin 203 (e.g., epoxy resin) having adhesiveness. Thereby, the wiring board 200 is manufactured (e.g., refer to patent document 1).
[Patent document 1] JP-A-2000-323613

However, in the conventional wiring board 200, the warp of the wiring board main body 201 is reduced by providing the stiffener 202 on the wiring board main body 201 that is the coreless substrate. Therefore, there is a problem that the size of the wiring board 200 in the thickness direction is larger.

SUMMARY OF THE INVENTION

Thus, the invention is achieved in the light of the above-mentioned problem, and it is an object of the invention to provide a wiring board and its manufacturing method in which the warp of the wiring board main body can be reduced and the size of the wiring board in the thickness direction can be smaller.

According to a first aspect of the invention, there is provided a wiring board including:
 a wiring board main body,
 a first dielectric layer, an electronic component attaching pad having a connection surface with which an electronic component is connected, and disposed inside the first dielectric layer to expose the connection surface, at least one second dielectric layer laminated on the first dielectric layer, a via hole and a wiring pattern provided on the first dielectric layer and the at least one second dielectric layer, and electrically connected with the electronic component attaching pad, and a warp reduction member for reducing a warp of the wiring board main body, disposed inside the first dielectric layer.

According to a second aspect of the invention, there is provided the wiring board according to the first aspect, wherein the connection surface of the electronic component attaching pad is almost flush with one surface of the first dielectric layer, and the surface of the warp reduction member located on the side of the connection surface of the electronic component attaching pad is almost flush with one surface of the first dielectric layer.

According to a third aspect of the invention, there is provided the wiring board according to the second aspect, wherein the warp reduction member is disposed on the same plane as the electronic component attaching pad, the thickness of the warp reduction member is almost equal to the thickness of the electronic component attaching pad, and the material of the warp reduction member is substantially the same as the material of the electronic component attaching pad.

According to a forth aspect of the invention, there is provided the wiring board according to any one of the first to third aspects, wherein the warp reduction member is a metal film.

According to a fifth aspect of the invention, there is provided the wiring board according to any one of the first to forth aspects, wherein the warp reduction member is disposed on the first dielectric layer located outside the first dielectric layer in a part corresponding to a formation area of the electronic component attaching pad, and the warp reduction member has a frame shape in plan view.

According to a sixth aspect of the invention, there is provided the wiring board according to any one of the first to fifth aspects, wherein the warp reduction member has a plurality of warp reduction portions, and the plurality of warp reduction portions are spaced from each other.

According to a seventh aspect of the invention, there is provided the wiring board according to any one of the first to sixth aspects, further including:

a solder resist layer exposing the connection surface of the electronic component attaching pad, and covering the surface of the warp reduction member located on the side of the connection surface of the electronic component attaching pad on one surface of the first dielectric layer.

With the invention, since the warp reduction member for reducing the warp of the wiring board main body is disposed inside the first dielectric layer, the warp of the wiring board man body can be reduced, and the size of the wiring board in the thickness direction can be smaller than the conventional wiring board having the stiffener.

According to an eighth aspect of the invention, there is provided a method for manufacturing a wiring board including: a wiring board main body, a first dielectric layer, an electronic component attaching pad having a connection surface with which an electronic component is connected, and disposed inside the first dielectric layer to expose the connection surface, at least one second dielectric layer laminated on the first dielectric layer, a via hole and a wiring pattern provided on the first dielectric layer and the at least one second dielectric layer, and electrically connected with the electronic component attaching pad, the method including:

an electronic component attaching pad and warp reduction member formation step of forming the electronic component attaching pad and a warp reduction member for reducing a warp of the wiring board main body on a carrier having conductivity at the same time;

a first dielectric layer formation step of forming the first dielectric layer on the carrier to cover the electronic component attaching pad and the warp reduction member; and a carrier removal step of removing the carrier after forming the first dielectric layer, the at least one second dielectric layer and the via hole and the wiring pattern.

According to a ninth aspect of the invention, there is provided the manufacturing method for the wiring board according to the eighth aspect, wherein the electronic component attaching pad and the warp reduction member are metal films, and the metal films are formed by plating.

According to a tenth aspect of the invention, there is provided the manufacturing method for the wiring board according to the eighth or ninth aspect, further including:

a solder resist layer formation step of forming a solder resist layer having an opening portion exposing a connection surface of the electronic component attaching pad on a surface of the first dielectric layer located on the side of the connection surface of the electronic component attaching pad, after the carrier removal step.

With the invention, since the electronic component attaching pad and the warp reduction member for reducing the warp of the wiring board main body are formed on the carrier having conductivity at the same time, the first dielectric layer is formed on the carrier to cover the electronic component attaching pad and the warp reduction member, and thereafter the carrier is removed after at least one second dielectric layer and the via hole and the wiring pattern are formed, the warp of the wiring board main body can be reduced. Also, since the surface of the warp reduction member in contact with the carrier is flush with the surface of the electronic component attaching pad and the surface of the first dielectric layer in contact with the carrier, the size of the wiring board in the thickness direction can be smaller than the conventional wiring board having the stiffener.

Moreover, since the warp reduction member can be formed without increasing the manufacturing process by forming the electronic component attaching pad and the warp reduction member at the same time, the cost (including the manufacturing cost) of the wiring board can be smaller than the conventional wiring board having the stiffener.

With the invention, the warp of the wiring board man body can be reduced, and the size of the wiring board in the thickness direction can be smaller.

DETAILED DESCRIPTION OF THE PREFERRED EMBODIMENTS

The embodiments of the present invention will be described below with reference to the drawings.

First Embodiment

Figure 6:
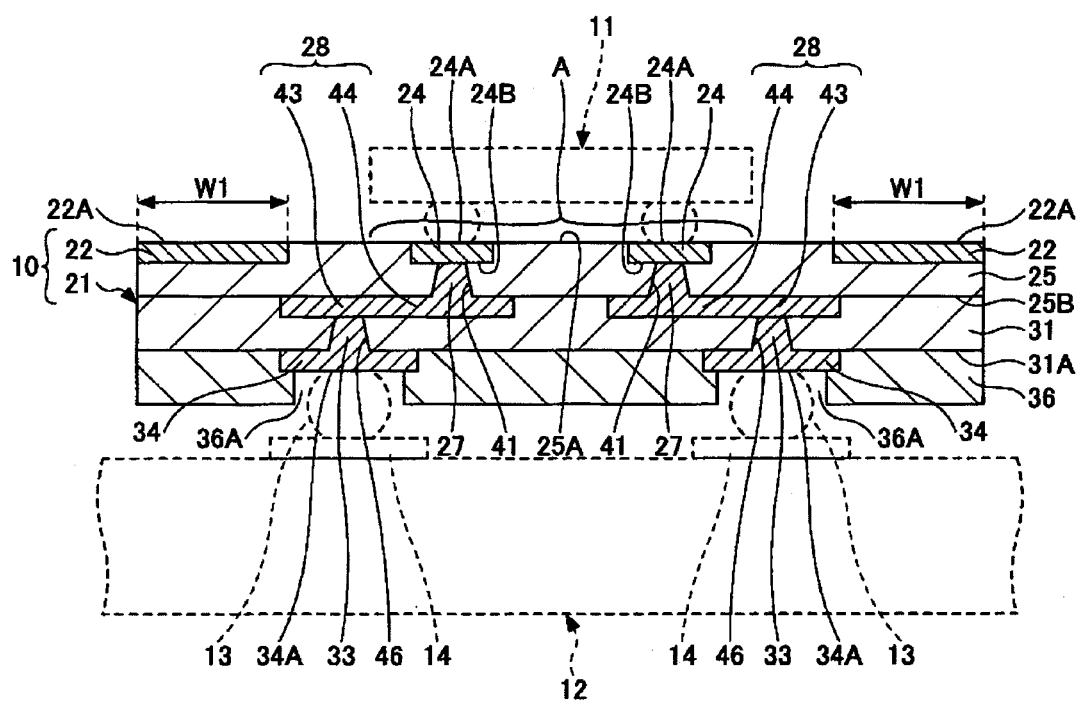
FIG. 6 is a cross-sectional view of a wiring board according to a first embodiment of the invention.

FIG. 6 is a cross-sectional view of a wiring board according to a first embodiment of the invention.

Referring to FIG. 6, the wiring board 10 of the first embodiment has a wiring board main body 21 that is a coreless substrate and a warp reduction member 22.

The wiring board main body 21 has an electronic component attaching pad 24, a dielectric layer 25 that is the first dielectric layer, the via holes 27 and 33, a wiring pattern 28, a dielectric layer 31 that is the second dielectric layer, an external connection pad 34 and a solder resist layer 36.

The electronic component attaching pad 24 has a connection surface 24A with which an electronic component 11 (e.g., semiconductor chip) is connected. The electronic component attaching pad 24 is disposed inside the dielectric layer 25 so that the connection surface 24A may be exposed out of the dielectric layer 25. The connection surface 24A is configured to be almost flush with a surface 25A of the dielectric layer 25 (surface of the dielectric layer 25 on the side where the electronic component 11 is disposed). The electronic component attaching pad 24 may be an Au/Pd/Ni laminated film in which an Au layer (e.g., 0.05 µm thick), a Pd layer (e.g., 0.5 µm thick) and an Ni layer (e.g., 5.0 µm thick) are laminated in order from the side of the surface 25A of the dielectric layer 25, an Au/Pd/Ni/Cu laminated film, an Au/Ni laminated film or an Au/Ni/Cu laminated film. In the case where an Ni layer is used as one of the components of the electronic component attaching pad 24, the film thickness of the Ni layer should be larger than the thickness of other layers. In this manner, if the film thickness of the Ni layer is made larger than the thickness of other layers, a warp of the wiring board main body 21 can be reduced. Also, in the case where a Cu layer that easily allows heavy deposition by plating is used as one of the components of the electronic component attaching pad 24, the warp of the wiring board main body 21 can be reduced by increasing the thickness of the Cu layer. In the case where the Au/Pd/Ni laminated film is used as the electronic component attaching pad 24, the electronic component attaching pad 24 can be formed by plating. The thickness of the electronic component attaching pad 24 may be from 5.0 µm to 15 µm, for example.

The warp reduction member 22 and the electronic component attaching pad 24 are disposed inside the dielectric layer 25. The dielectric layer 25 exposes the connection surface 24A of the electronic component attaching pad 24 and the surface 22A of the warp reduction member 22 (surface of the warp reduction member 22 on the side where the electronic component 11 is disposed). The surface 25A of the dielectric layer 25 is configured to be almost flush with the connection surface 24A of the electronic component attaching pad 24 and the surface 22A of the warp reduction member 22. The dielectric layer 25 has an opening portion 41 for exposing the surface 24B of the electronic component attaching pad 24 located on the opposite side of the connection surface 24A. The dielectric layer 25 may be a resin layer with an insulation resin such as epoxy resin or polyimide resin as the parent material, for example. In the case where the resin layer with epoxy resin as the parent material is used as the dielectric layer 25, the thickness of the dielectric layer 25 may be 45 μm, for example. Also, the opening portion 41 may be formed by a laser processing method, for example.

A via hole 27 is provided in the opening portion 41. One end portion of the via hole 27 is connected with the electronic component attaching pad 24, and the other end portion thereof is integrated with the wiring pattern 28. Thereby, the via hole 27 electrically connects the electronic component attaching pad 24 and the wiring pattern 28.

The wiring pattern 28 has a pad 43 and a wiring 44. The pad 43 is provided on a surface 25B of the dielectric layer 25. The pad 43 is integrated with the wiring 44. The pad 43 is electrically connected via the wiring 44 with the via hole 27.

The wiring 44 is provided at the other end portion of the via hole 27 and on the surface 25B of the dielectric layer 25. The wiring 44 is integrated with the via hole 27 and the pad 43. The thickness of the wiring pattern 28 with the above constitution may be 15 μm, for example. The material of the via hole 27 and the wiring pattern 28 may be Cu, for example. The via hole 27 and the wiring pattern 28 may be formed by a semi-additive method, for example.

The dielectric layer 31 is provided on the surface 25B of the dielectric layer 25 to cover the wiring 28. The dielectric layer 31 has an opening portion 46 for exposing a part of the pad 43. The dielectric layer 31 may be a resin layer with the insulation resin such as epoxy resin or polyimide resin as the parent material, for example. In the case where the resin layer with epoxy resin as the parent material is used as the dielectric layer 31, the thickness of the dielectric layer 31 may be 45 μm, for example. Also, the opening portion 46 may be formed by a laser processing method, for example.

A via hole 33 is provided in the opening portion 46. One end portion of the via hole 33 is connected with the pad 43, and the other end portion thereof is integrated with the external connection pad 34. Thereby, the via hole 33 electrically connects the external connection pad 34 and the pad 43.

The external connection pad 34 is provided at the other end portion of the via hole 33 and on a surface 31A of the dielectric layer 31 (surface of the dielectric layer 31 located on the opposite side of the surface where the dielectric layer 25 is provided). The external connection pad 34 has a terminal disposition surface 34A on which an external connection terminal 13 is disposed. The external connection pad 34 is electrically connected via the external connection terminal 13 disposed on the terminal disposition surface 34A with the pad 14 provided on a mounting board 12 such as a mother board. The external connection pad 34 is integrated with the via hole 33. The thickness of the external connection pad 34 may be 15 μm, for example. The material of the via hole 33 and the external connection pad 34 may be Cu, for example. The via hole 33 and the external connection pad 34 may be formed by a semi-additive method, for example.

The solder resist layer 36 is provided on the surface 31A of the dielectric layer 31 to expose the terminal disposition surface 34A of the external connection pad 34. The solder resist layer 36 has an opening portion 36A for exposing the terminal disposition surface 34A. The material of the solder resist layer 36 may be photosensitive resin such as epoxy or acrylic, for example. The thickness of the solder resist layer 36 may be 20 μm, for example.

Figure 7:
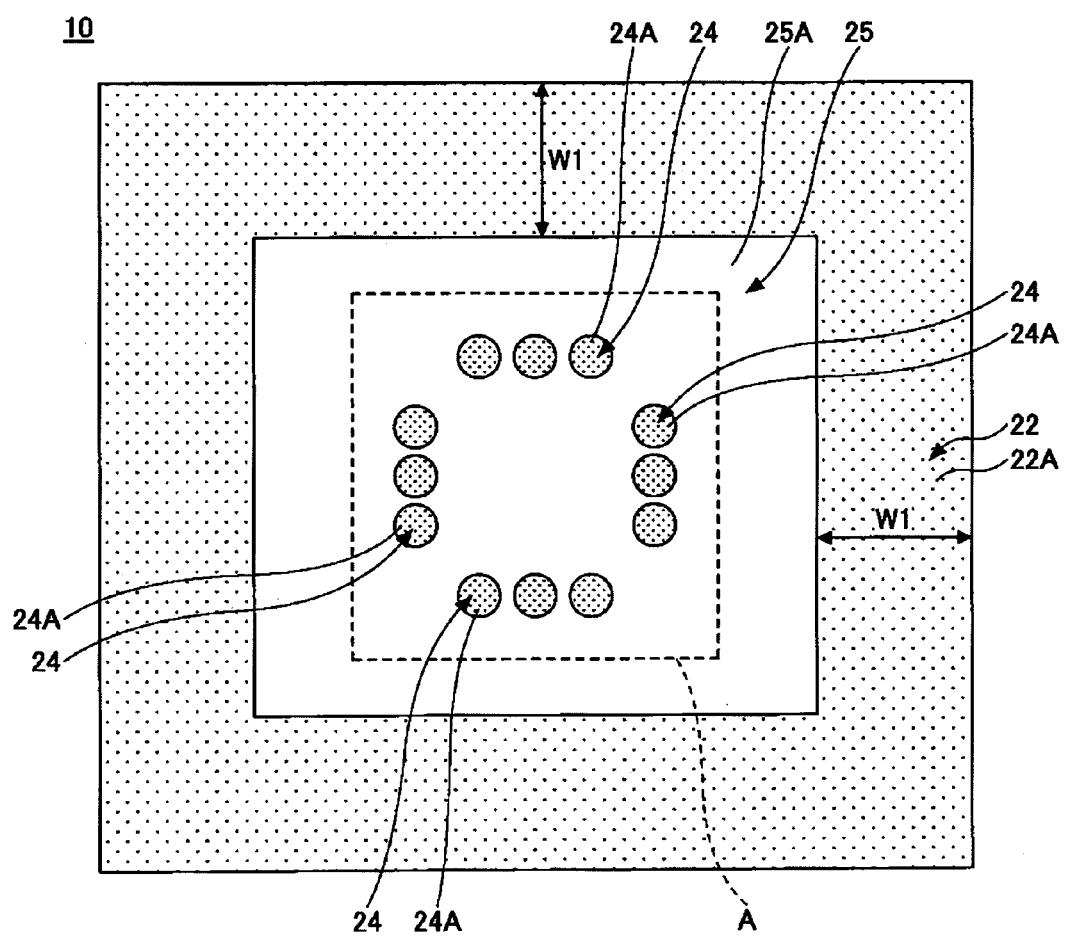
FIG. 7 is a plan view of the wiring board as shown in FIG. 6.

FIG. 7 is a plan view of the wiring board as shown in FIG. 6. In FIG. 7, the same or like parts are designated by the same reference numerals or signs as the wiring board 10 of the first embodiment.

Referring to FIGS. 6 and 7, the warp reduction member 22 is the member for reducing the warp of the wiring board main body 21, and is disposed internally on the side of the surface 25A of the dielectric layer 25. The surface 22A of the warp reduction member 22 located on the side where the electronic component 11 is disposed is configured to be almost flush with the surface 24A of the electronic component attaching pad 24 and the surface 25A of the dielectric layer 25.

Figure 1:
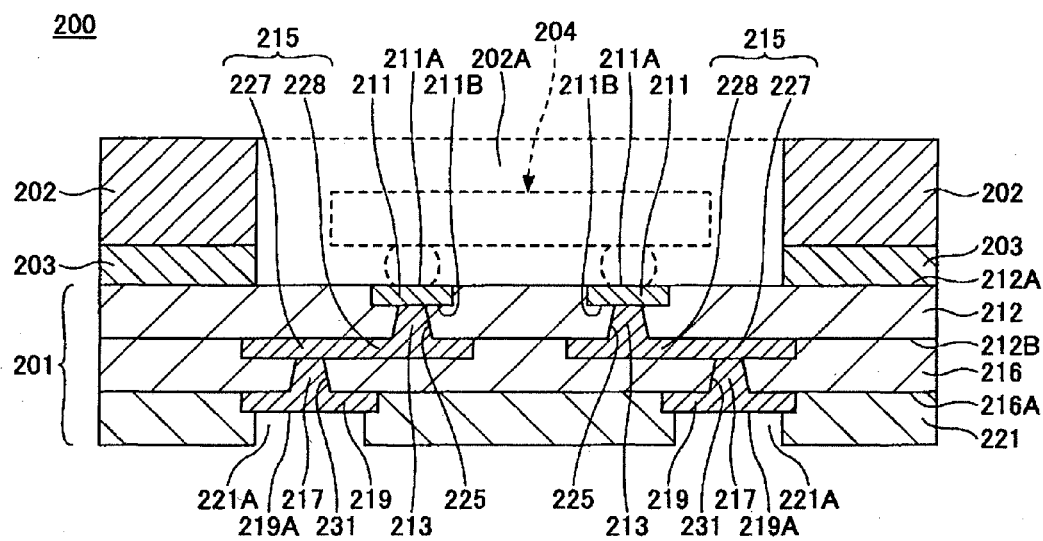
FIG. 1 is a cross-sectional view of the conventional wiring board.
Figure 2:
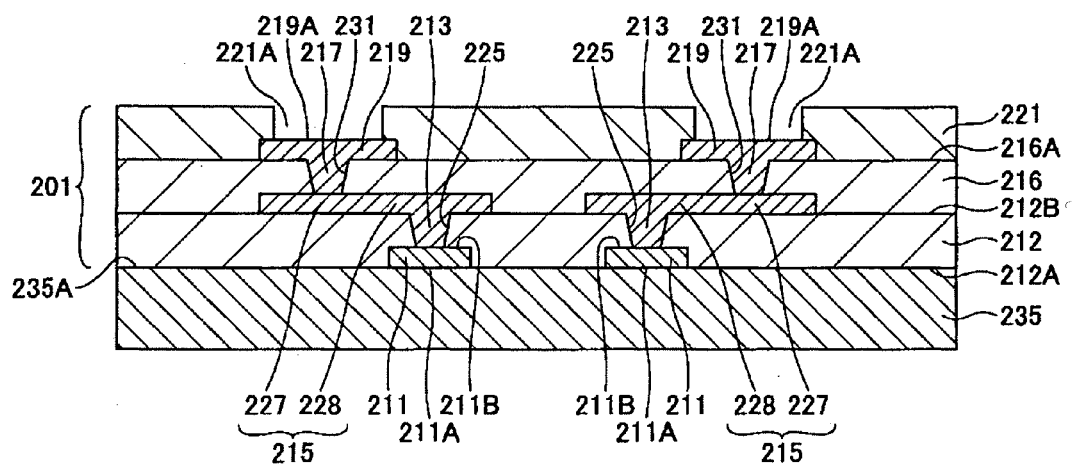
FIG. 2 is a view (No. 1) showing a manufacturing process for the conventional wiring board.
Figure 3:
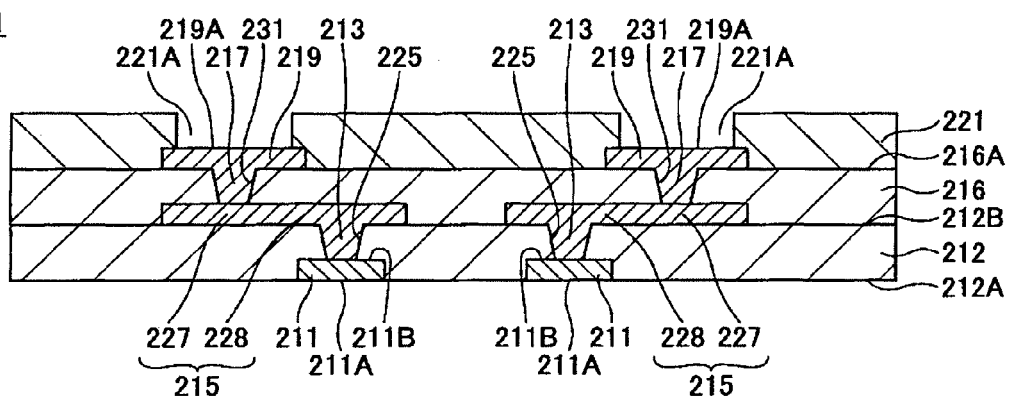
FIG. 3 is a view (No. 2) showing the manufacturing process for the conventional wiring board.
Figure 4:
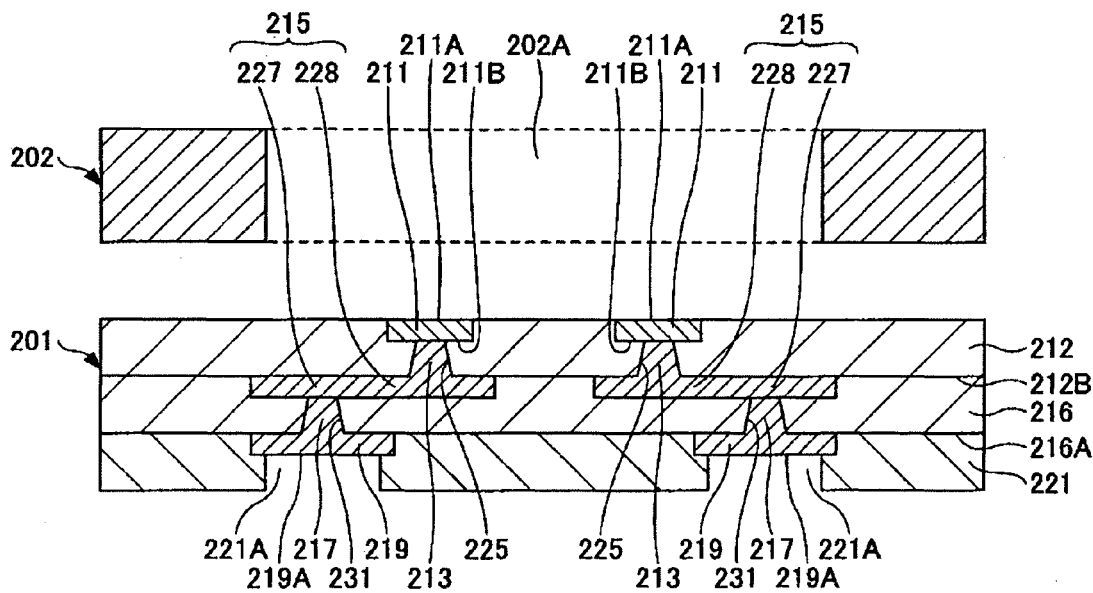
FIG. 4 is a view (No. 3) showing the manufacturing process for the conventional wiring board.
Figure 5:
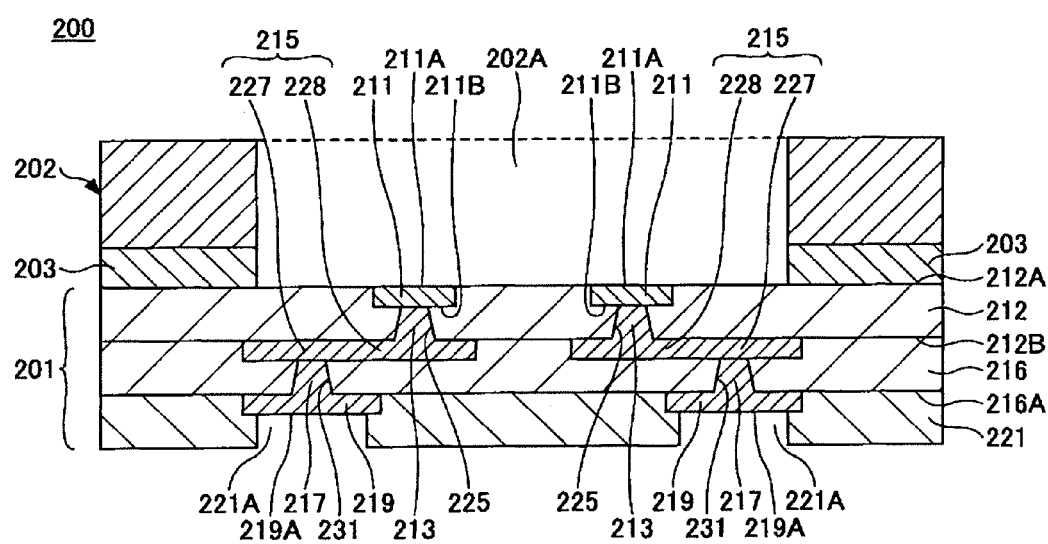
FIG. 5 is a view (No. 4) showing the manufacturing process for the conventional wiring board.

In this manner, since the warp reduction member 22 for reducing the warp of the wiring board main body 21 is disposed inside the dielectric layer 25, and the surface 22A of the warp reduction member 22 located on the side where the electronic component 11 is disposed is configured to be almost flush with the surface 24A of the electronic component attaching pad 24 and the surface 25A of the dielectric layer 25, the warp of the wiring board main body 21 can be reduced, and the size of the wiring board 10 in the thickness direction can be smaller (thinner) than the conventional wiring board 200 (see FIG. 1) having the stiffener 202. In other words, the warp of the wiring board main body 21 can be reduced without increasing the size of the wiring board main body 21.

The warp reduction member 22 has a frame shape in plan view. The outer shape of the warp reduction member 22 is almost equivalent to the outer shape of the wiring board main body in plan view (in other words, outer shape of the dielectric layer 25 in plan view). The warp reduction member 22 is disposed on the dielectric layer 25 in a part located outside the electronic component attaching pad formation area A formed with a plurality of electronic component attaching pads 24.

The warp reduction member 22 is disposed on the same plane as the electronic component attaching pad 24. Also, the thickness of the warp reduction member 22 is roughly equal to the thickness of the electronic component attaching pad 24, and the material of the warp reduction member 22 is substantially the same as the material of the electronic component attaching pad 24.

In this manner, since the warp reduction member 22 is disposed on the same plane as the electronic component attaching pad 24, the thickness of the warp reduction member 22 being roughly equal to the thickness of the electronic component attaching pad 24, and the material of the warp reduction member 22 being substantially the same as the material of the electronic component attaching pad 24, the electronic component attaching pad 24 and the warp reduction member 22 can be formed at the same time when forming the electronic component attaching pad 24.

The warp reduction member 22 may be a metal film, for example. In the case where the metal film is used as the warp reduction member 22, the warp reduction member 22 may be an Au/Pd/Ni laminated film in which an Au layer (e.g., 0.05 μm thick), a Pd layer (e.g., 0.5 μm thick) and an Ni layer (e.g., 5.0 μm thick) are laminated in order from the side of the surface 25A of the dielectric layer 25, an Au/Pd/Ni/Cu laminated film, an Au/Ni laminated film, or an Au/Ni/Cu laminated film. Also, in the case where an Ni layer is used as one of the components of the warp reduction member 22, the film thickness of the Ni layer should be larger than the thickness of other layers. In this manner, if the film thickness of the Ni layer is made larger than the thickness of other layers, the warp of the wiring board main body 21 can be reduced. Also, in the case where a Cu layer that easily allows heavy deposition by plating is used as one of the components of the warp reduction member 22, the warp of the wiring board main body 21 can be reduced by increasing the thickness of the Cu layer.

In this manner, by using the metal film as the warp reduction member 22, the cost (including the manufacturing cost) of the warp reduction member 22 can be lower than the stiffener 202 (see FIG. 1) provided on the conventional wiring board 200, whereby the cost of the wiring board 10 can be reduced. Also, by using the metal film as the warp reduction member 22, the thickness of the warp reduction member 22 can be thinner. The thickness of the warp reduction member 22 may be from 5.0 μm to 15.0 μm, for example. Also, if the outer shape of the wiring board main body 21 in plan view is 34 mm×34 mm, and the electronic component attaching pad formation area A is 10 mm×10 mm, the width W1 of the warp reduction member 22 can be 5.0 mm, for example.

In the wiring board of this embodiment, the warp reduction member 22 for reducing the warp of the wiring board main body 21 is disposed inside the dielectric layer 25, and the surface 22A of the warp reduction member 22 located on the side where the electronic component 11 is disposed is configured to be almost flush with the surface 24A of the electronic component attaching pad 24 and the surface 25A of the dielectric layer 25, whereby the warp of the wiring board main body 21 can be reduced, and the size of the wiring board 10 in the thickness direction can be smaller than the conventional wiring board 200 (see FIG. 1) having the stiffener 202. In other words, the warp of the wiring board main body 21 can be reduced without increasing the size of the wiring board main body 21 that is the coreless substrate.

Also, by using the metal film as the warp reduction member 22, the cost (including the manufacturing cost) of the warp reduction member 22 can be lower than the stiffener 202 (see FIG. 1) provided on the conventional wiring board 200, whereby the cost of the wiring board 10 can be reduced.

It should be noted that the warp reduction member 22 may be connected to the ground or power source wiring and used as a ground plane or power source plane.

Figure 8:
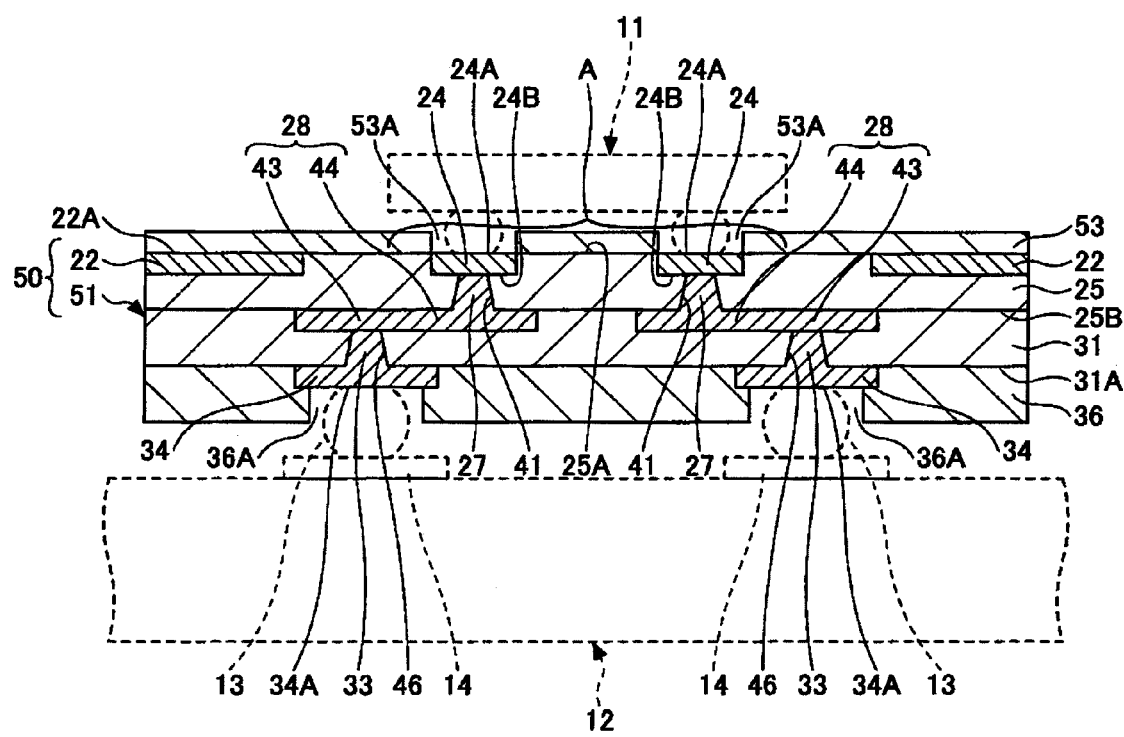
FIG. 8 is a cross-sectional view of a wiring board according to a modification of the first embodiment of the invention.

FIG. 8 is a cross-sectional view of a wiring board according to a modification of the first embodiment of the invention. In FIG. 8, the same or like parts are designated by the same reference numerals or signs as the wiring board 10 of the first embodiment.

Referring to FIG. 8, the wiring board 50 according to the modification of the first embodiment is the same as the wiring board 10, except that a wiring board main body 51 is provided, instead of the wiring board main body 21 provided in the wiring board 10 of the first embodiment.

The wiring board main body 51 is the same as the wiring board main body 21, except that a solder resist layer 53 is further provided, in addition to the constitution of the wiring board main body 21 provided in the wiring board 10 of the first embodiment.

The solder resist layer 53 is provided on the surface 25A of the dielectric layer 25 to cover the surface 22A of the warp reduction member 22. The solder resist layer 53 has an opening portion 53A exposing the connection surface 24A of the electronic component attaching pad 24.

The wiring board 50 with this constitution can achieve the same effects as the wiring board 10 of the first embodiment.

Figure 18:
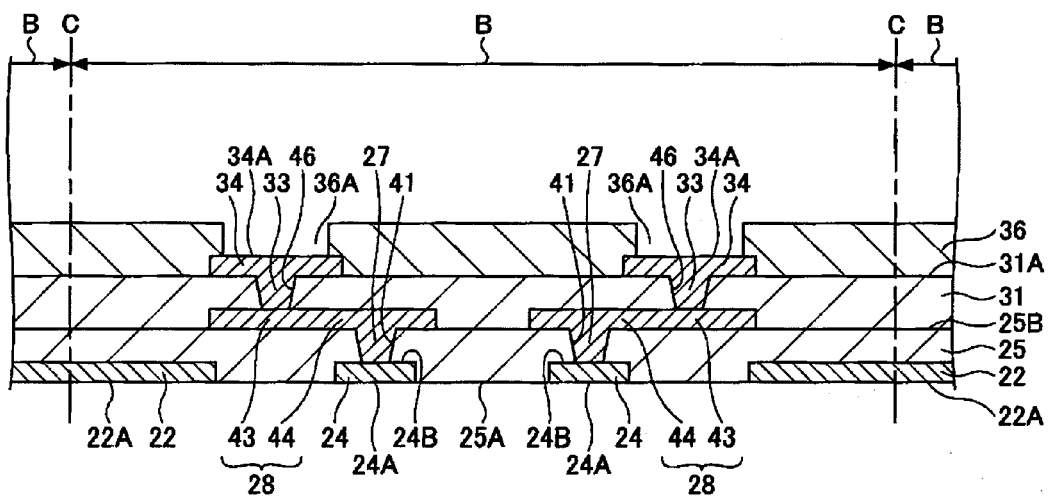
FIG. 18 is a view (No. 8) showing the manufacturing process for the wiring board according to the first embodiment of the invention.
Figure 19:
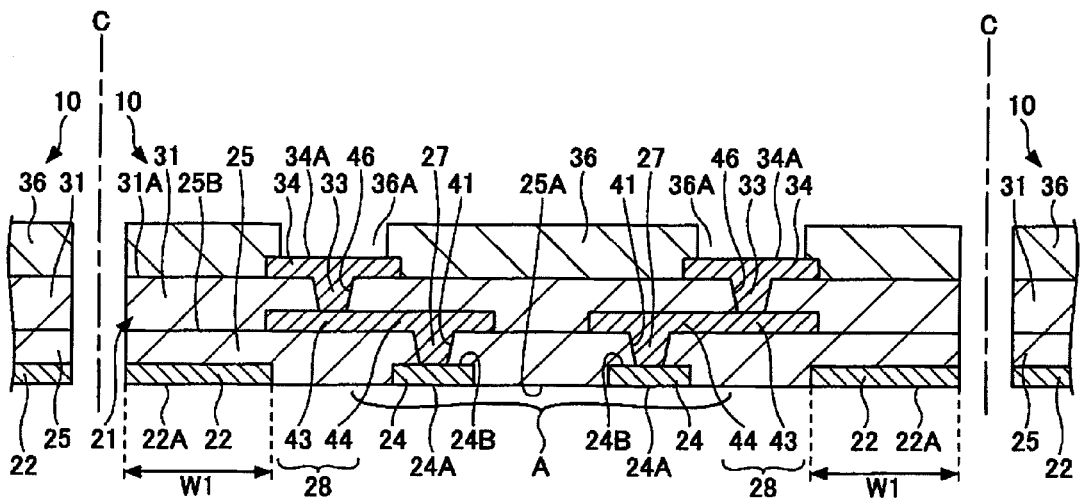
FIG. 19 is a view (No. 9) showing the manufacturing process for the wiring board according to the first embodiment of the invention.

The wiring board 50 with the above constitution according to the modification of the first embodiment can be manufactured by performing, after a process as shown in FIG. 18, a solder resist layer formation process for forming the solder resist layer 53 on the surface 25A of the dielectric layer 25 and a cutting process as shown in FIG. 19, as will be described later.

Figure 9:
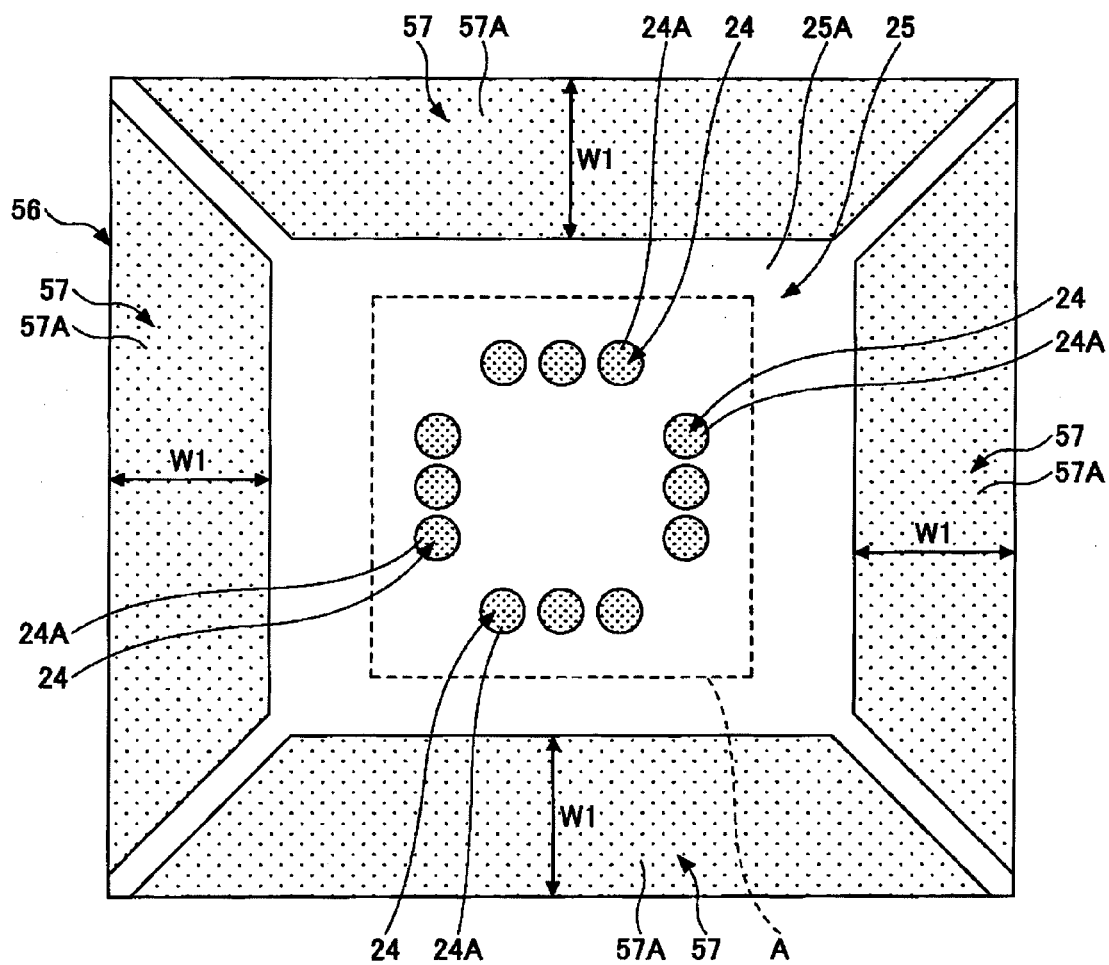
FIG. 9 is a plan view (No. 1) for explaining another warp reduction member.
Figure 10:
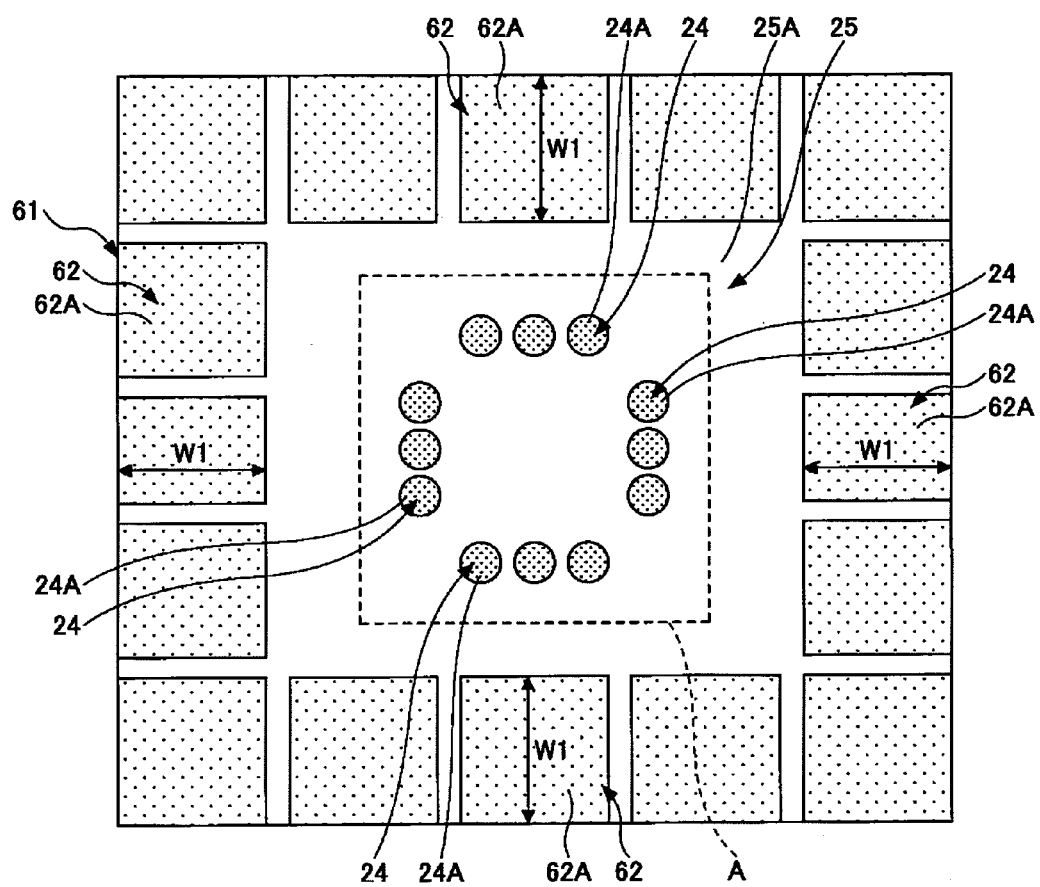
FIG. 10 is a plan view (No. 2) for explaining another warp reduction member.

FIGS. 9 and 10 are plan views for explaining the other warp reduction members. In FIGS. 9 and 10, the same or like parts are designated by the same reference numerals or signs as the wiring board 10 of the first embodiment.

Though the warp reduction member 22 having the frame shape in plan view is provided in the wiring board main body 21, 51 in this embodiment, a warp reduction member 56 as shown in FIG. 9 or a warp reduction member 61 as shown in FIG. 10 may be provided instead of the warp reduction member 22.

Referring to FIG. 9, the warp reduction member 56 has four warp reduction portions 57. The warp reduction portions 57 are provided on the same plane as the electronic component attaching pad 24. The surface 57A of the warp reduction portion 57 is configured to be almost flush with the surface 24A of the electronic component attaching pad 24 and the surface 25A of the dielectric layer 25. The thickness of the warp reduction portion 57 is roughly equal to the thickness of the electronic component attaching pad 24, and the material of the warp reduction portion 57 is substantially the same as the material of the electronic component attaching pad 24. The four warp reduction portions 57 are arranged at the positions spaced from each other.

In this manner, since the warp reduction member 56 having a plurality of (four in this case) warp reduction portions 57 arranged at positions spaced from each other is provided in the wiring board main body 21, 51, the stress occurring within the wiring board main body 21, 51 can be reduced.

Referring to FIG. 10, the warp reduction member 61 has a plurality of warp reduction portions 62 having a smaller area than the warp reduction portion 57 as shown in FIG. 9. The warp reduction portions 62 are provided on the same plane as the electronic component attaching pad 24. The surface 62A of the warp reduction portion 62 is configured to be almost flush with the surface 24A of the electronic component attaching pad 24 and the surface 25A of the dielectric layer 25. The thickness of the warp reduction portion 62 is roughly equal to the thickness of the electronic component attaching pad 24, and the material of the warp reduction portion 62 is substantially the same as the material of the electronic component attaching pad 24. The four warp reduction portions 62 are arranged at the positions spaced from each other.

In the case where the warp reduction member 61 with this constitution is provided in the wiring board main body 21, 51, the stress occurring within the wiring board main body 21, 51 can be also reduced.

If the warp reduction member 22 including a metal film is integrated in the shape of a frame in plan view, and the warp reduction member 22 has a large area, the stress occurs between the warp reduction member 22 and the dielectric layer 25, 31 due to a difference in the thermal expansion coefficient between the warp reduction member 22 and the dielectric layer 25, 31, possibly causing a warp in the wiring board main body 21, 51. However, the stress between the warp reduction member 56, 61 and the dielectric layer 25, 31 can be reduced by using the warp reduction member 56, 61 that is divided into the plurality of warp reduction portions 57, 62 owing to a slit-like space (non-formation portion of the warp reduction member 56, 61).

Though the warp reduction member 56, 61 is divided into the plurality of warp reduction portions 57, 62 by the linear slit in this embodiment as described above, the warp reduction member 56, 61 may be divided into the plurality of warp reduction portions 57, 62 using the curved slit or bent slit. In this manner, by dividing the warp reduction member 56, 61 into the plurality of warp reduction portions 57, 62 using the curved slit or bent slit, there is a greater effect of reducing the warp in the wiring board main body 21, 51 than dividing the warp reduction member 56, 61 into the plurality of warp reduction portions 57, 62 by the linear slit.

It should be noted that the warp reduction member 56, 61 may be connected to the ground or power source wiring and used as a ground plane or power source plane.

Though one dielectric layer 31 (second dielectric layer) is laminated on the dielectric layer 25 (first dielectric layer) in the wiring board main body 21, 51 in this embodiment as described above, two or more dielectric layers 31 (second dielectric layers) may be laminated on the dielectric layer 25 (first dielectric layer), and the via hole and the wiring pattern for electrically connecting the electronic component attaching pad 24 and the external connection pad 34 may be provided on the two or more laminated dielectric layers 31.

FIGS. 11 to 19 are views showing a manufacturing process for the wiring board according to the first embodiment of the invention. In FIGS. 11 to 19, the same or like parts are designated by the same reference numerals or signs as the wiring board 10 of the first embodiment. Also, reference sign C as indicated in FIGS. 11 to 19 designates a cutting position (hereinafter referred to as a "cutting position C") of cutting the structure as shown in FIG. 19 formed on a carrier 71 as will be described later.

Figure 11:
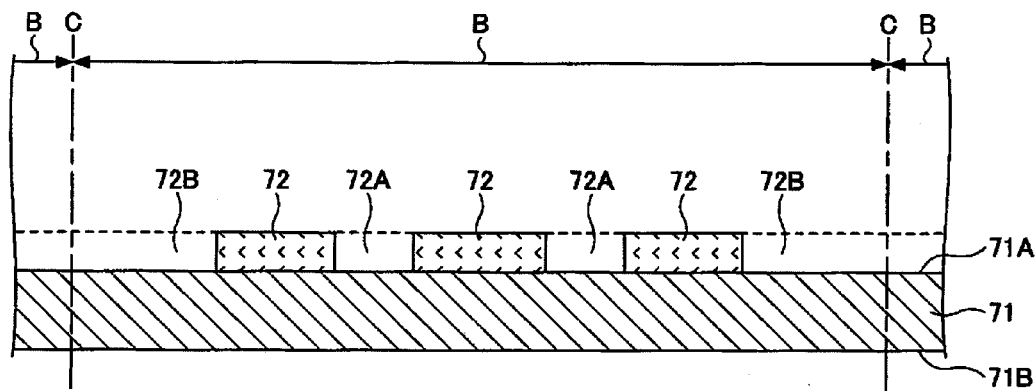
FIG. 11 is a view (No. 1) showing a manufacturing process for the wiring board according to the first embodiment of the invention.

Referring to FIGS. 11 to 19, a manufacturing method for the wiring board 10 of the first embodiment will be described below. At first, in the process as shown in FIG. 11, a resist film 72 having an opening portion 72A, 72B is formed on an upper surface 71A of the carrier 71 having a plurality of wiring board formation areas B in which the wiring board 10 is formed. At this time, the opening portion 72A is formed to expose the upper surface 71A of the carrier 71 in a part corresponding to the formation area of the electronic component attaching pad 24. Also, the opening portion 72B is formed to expose the upper surface 71A of the carrier 71 in a part corresponding to the formation area of the warp reduction member 22. As the carrier 71 having conductivity, a metal plate (e.g., Cu plate) or a metal foil (e.g., Cu foil) may be used.

Figure 12:
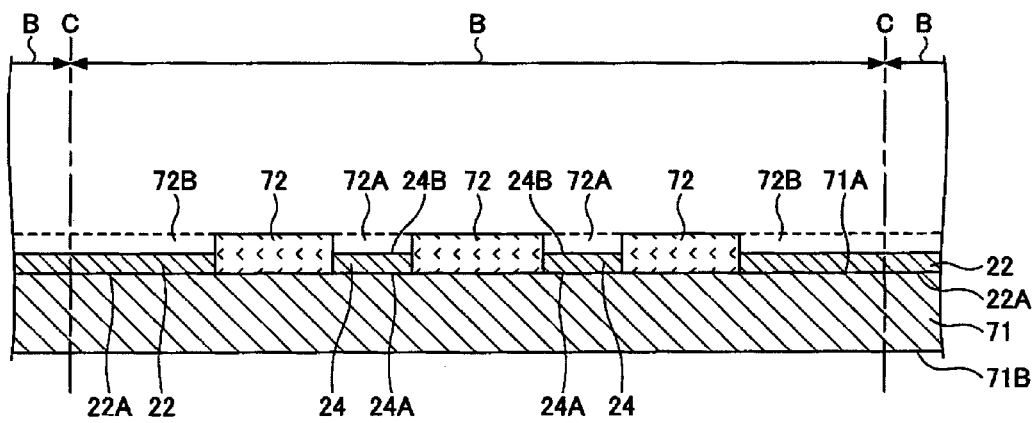
FIG. 12 is a view (No. 2) showing the manufacturing process for the wiring board according to the first embodiment of the invention.

Next, in the process as shown in FIG. 12, by plating, the electronic component attaching pad 24 is formed on the upper surface 71A of the carrier 71 in a part exposed to the opening portion 72A, and the warp reduction member 22 is formed on the upper surface 71A of the carrier 71 in a part exposed to the opening portion 72B. That is, by plating, the electronic component attaching pad 24 and the warp reduction member 22 are formed on the upper surface 71A of the carrier 71 at the same time (formation process for electronic component attaching pad and warp reduction member). At this stage, the warp reduction member 22 is integrated with the warp reduction member 22 provided in the adjacent wiring board formation area B. The warp reduction member 22 as shown in FIG. 12 is cut along the cutting position C and individuated into the warp reduction members 22 as shown in FIG. 6 through the process as shown in FIG. 19 as will be described later.

The electronic component attaching pad 24 and the warp reduction member 22 may be made of an Au/Pd/Ni laminated film in which an Au layer (e.g., 0.05 μm thick), a Pd layer (e.g., 0.5 μm thick) and an Ni layer (e.g., 5.0 μm thick) are laminated in order, an Au/Pd/Ni/Cu laminated film, an Au/Ni laminated film or an Au/Ni/Cu laminated film. In the case where an Ni layer is used as one of the components of the electronic component attaching pad 24 and the warp reduction member 22, the film thickness of the Ni layer should be larger than the thickness of other layers. In this manner, if the film thickness of the Ni layer is made larger than the thickness of other layers, the warp of the wiring board main body 21 can be reduced. Also, in the case where a Cu layer that easily allows heavy deposition by plating is used as one of the components of the electronic component attaching pad 24 and the warp reduction member 22, the warp of the wiring board main body 21 can be reduced by increasing the thickness of the Cu layer.

In the case where the Au/Pd/Ni laminated film is used as the electronic component attaching pad 24 and the warp reduction member 22, an Au layer (e.g., 0.05 μm thick), a Pd layer (e.g., 0.5 μm thick) and an Ni layer (e.g., 5.0 μm thick) are deposited and grown in order on the upper surface 71A of the carrier 71 in a part exposed to the opening portion 72A, 72B by electrolytic plating with the carrier 71 having conductivity as a feed layer, whereby the electronic component attaching pad 24 and the warp reduction member 22 are formed at the same time.

In this manner, since the electronic component attaching pad 24 and the warp reduction member 22 are formed at the same time by plating, it is unnecessary to provide the process for forming the warp reduction member 22 separately, and prepare the material for making the warp reduction member 22 separately, whereby the cost (including the manufacturing cost) of the wiring board 10 having the warp reduction member 22 can be reduced.

Also, since the electronic component attaching pad 24 and the warp reduction member 22 are formed by plating, the thickness of the warp reduction member 22 can be thinner. The thickness of the warp reduction member 22 may be from 5.0 μm to 15.0 μm, for example.

Figure 13:
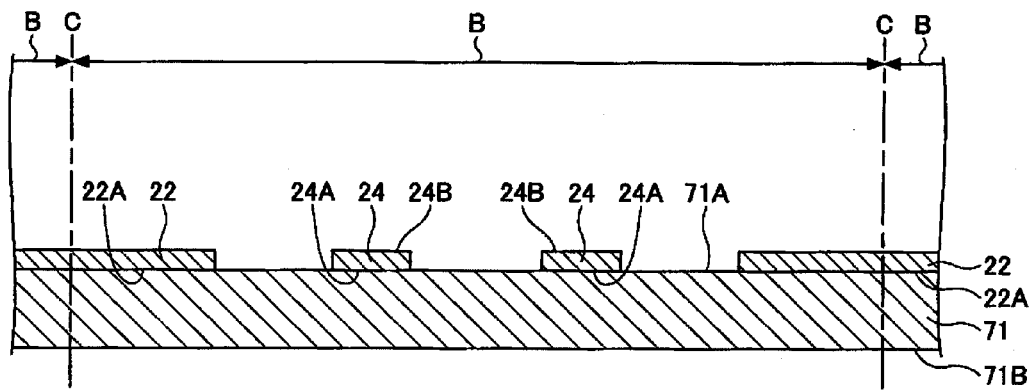
FIG. 13 is a view (No. 3) showing the manufacturing process for the wiring board according to the first embodiment of the invention.
Figure 14:
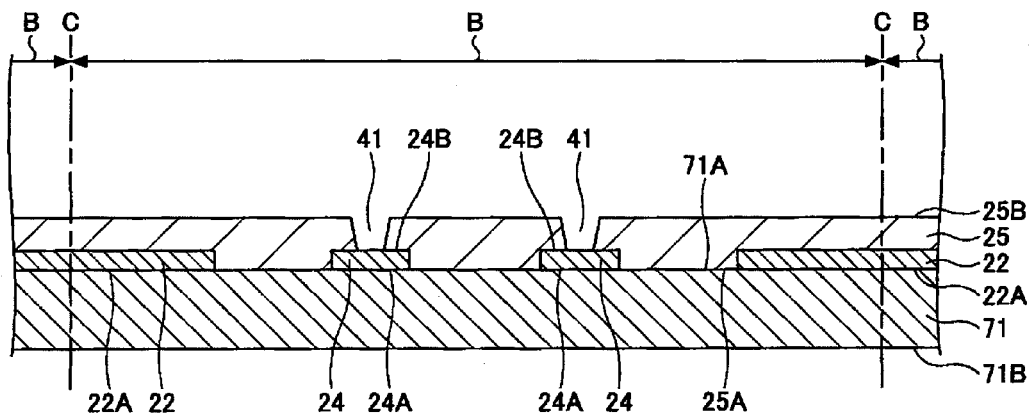
FIG. 14 is a view (No. 4) showing the manufacturing process for the wiring board according to the first embodiment of the invention.

Next, in the process as shown in FIG. 13, the resist film 72 is removed. Next, in the process as shown in FIG. 14, the dielectric layer 25 is formed on the upper surface 71A of the carrier 71 to cover the electronic component attaching pad 24 and the warp reduction member 22 (first dielectric layer formation process), and then the opening portion 41 exposing apart of the surface 24B of the electronic component attaching pad 24 is formed in the dielectric layer 25. The dielectric layer 25 may be a resin layer with an insulation resin such as epoxy resin or polyimide resin as the patent material, for example. Also, the opening portion 41 can be formed by a laser processing method, for example.

Figure 15:
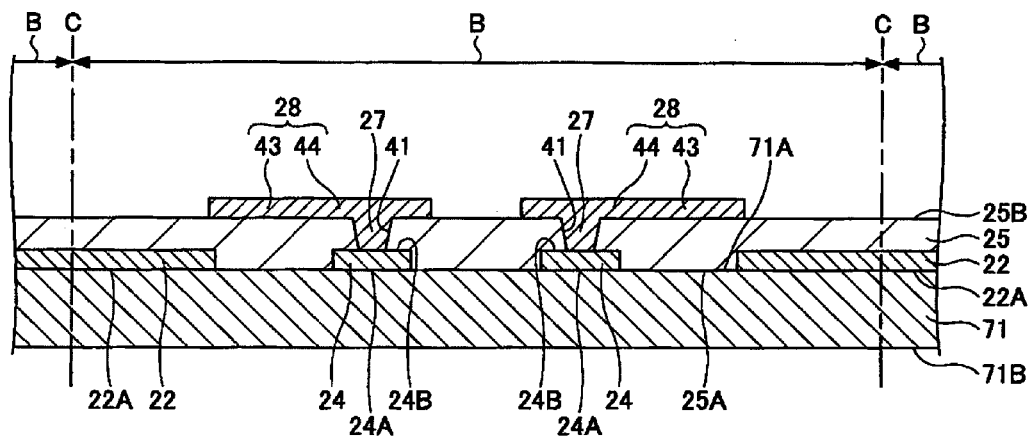
FIG. 15 is a view (No. 5) showing the manufacturing process for the wiring board according to the first embodiment of the invention.

Next, in the process as shown in FIG. 15, the via hole 27 and the wiring pattern 28 are formed at the same time. The material of the via hole 27 and the wiring pattern 28 may be Cu, for example. In the case where the material of the via hole 27 and the wiring pattern 28 is Cu, the via hole 27 and the wiring pattern 28 may be formed by a semi-additive method, for example. The thickness of the wiring pattern 28 may be 15 μm, for example.

Figure 16:
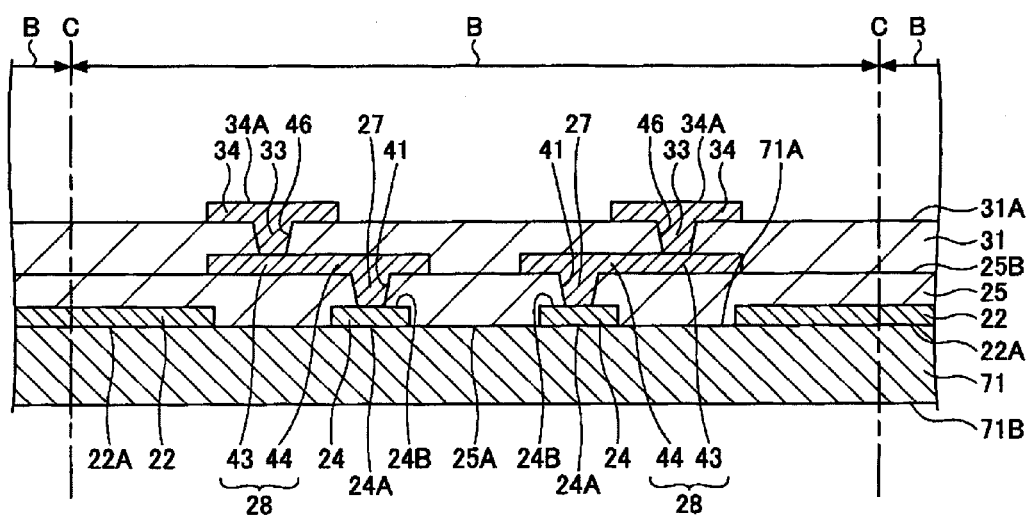
FIG. 16 is a view (No. 6) showing the manufacturing process for the wiring board according to the first embodiment of the invention.

Next, in the process as shown in FIG. 16, the dielectric layer 31 (second dielectric layer) having the opening portion 46, the via hole 33 and the external connection pad 34 are formed by performing the same method as the previously described process as shown in FIGS. 14 and 15. The dielectric layer 31 may be a resin layer with an insulation resin such as epoxy resin or polyimide resin as the patent material, for example. Also, the opening portion 46 can be formed by a laser processing method, for example. In the process as shown in FIG. 16, the via hole 33 and the external connection pad 34 are formed at the same time. The material of the via hole 33 and the external connection pad 34 may be Cu, for example. In the case where the material of the via hole 33 and the external connection pad 34 is Cu, the via hole 33 and the external connection pad 34 may be formed by a semi-additive method, for example. The thickness of the external connection pad 34 may be 15 μm, for example.

Figure 17:
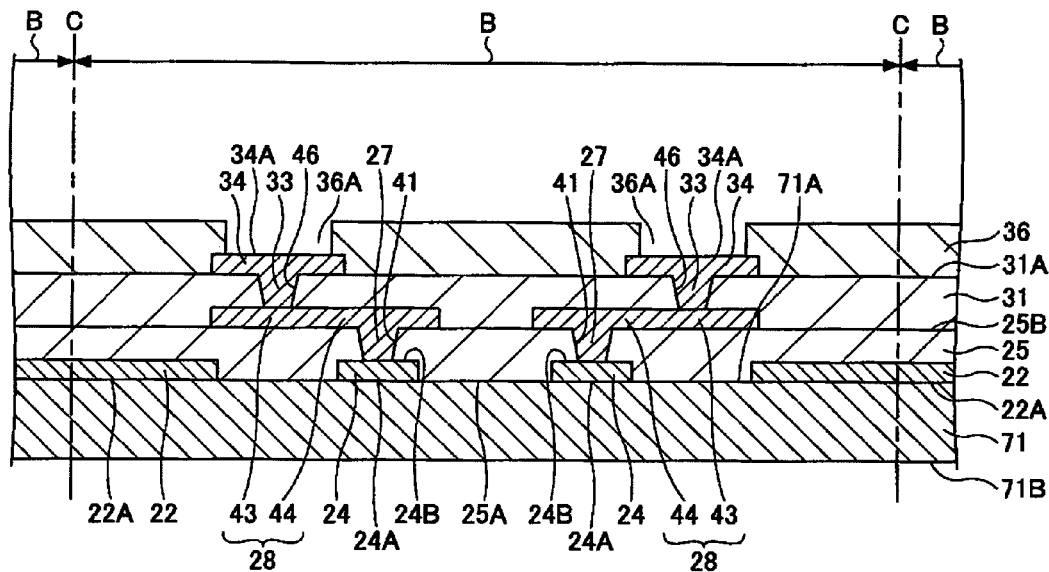
FIG. 17 is a view (No. 7) showing the manufacturing process for the wiring board according to the first embodiment of the invention.

Next, in the process as shown in FIG. 17, the solder resist layer 36 having the opening portion 36A exposing the terminal disposition surface 34A of the external connection pad 34 is formed on the surface 31A of the dielectric layer 31 by a well-known method (solder resist layer formation process). Thereby, a structure equivalent to a plurality of wiring boards 10 is formed on the carrier 71 in a part corresponding to a plurality of wiring board formation areas B. The material of the solder resist layer 36 may be photosensitive resin such as epoxy or acrylic. The thickness of the solder resist layer 36 may be 20 μm, for example.

Next, in the process as shown in FIG. 18, the carrier 71 as shown in FIG. 17 is removed (carrier removal process). More specifically, if the carrier 71 is the Cu plate or Cu foil, the carrier 71 is removed by etching, for example.

Next, in the process as shown in FIG. 19, the structure as shown in FIG. 18 is cut along the cutting position C and individuated into the plurality of wiring boards 10, whereby the plurality of wiring boards 10 are manufactured. In this case, the plurality of warp reduction members 22 integrated are cut and individuated into the plurality of warp reduction members 22. For cutting the structure as shown in FIG. 18, a dicer may be employed, for example.

With the manufacturing method for the wiring board according to this embodiment, the electronic component attaching pad 24 and the warp reduction member 22 for reducing the warp of the wiring board main body 21 are formed on the carrier 71 having conductivity at the same time, the dielectric layer 25 is then formed on the carrier 71 to cover the electronic component attaching pad 24 and the warp reduction member 22, the via holes 27 and 33, the wiring pattern 28, the dielectric layer 31, the external connection pad 34 and the solder resist layer 36 are formed, and the carrier 71 is removed, whereby the warp of the wiring board main body 21 can be reduced, and because the warp reduction member 22 is disposed inside the dielectric layer 25 so that the surface 22A of the warp reduction member 22 in contact with the carrier 71 may be almost flush with the surface 24A of the electronic component attaching pad 24 in contact with the carrier 71 and the surface 25A of the dielectric layer 25, the size of the wiring board 10 in the thickness direction can be smaller than the conventional wiring board 200 (see FIG. 1) having the stiffener 202.

Since the electronic component attaching pad 24 and the warp reduction member 22 are formed at the same time, the warp reduction member 22 can be formed without increasing the number of steps in the manufacturing process, whereby the cost (including the manufacturing cost) of the wiring board 10 can be lower than the conventional wiring board 200 having the stiffener 202.

Second Embodiment

Figure 20:
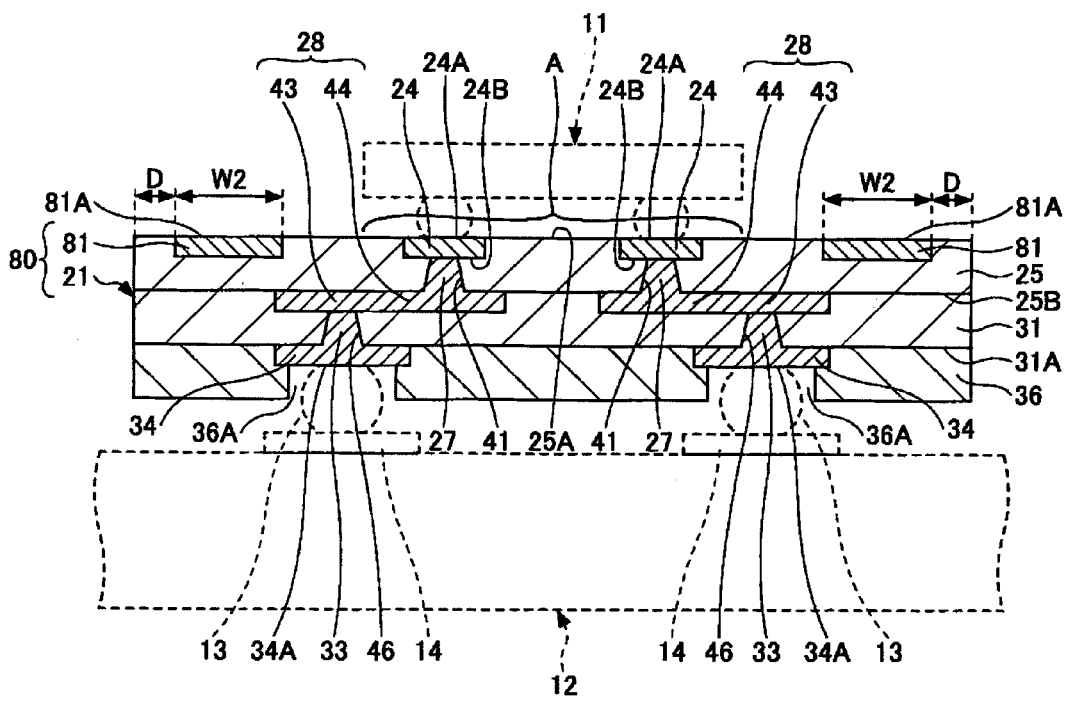
FIG. 20 is a cross-sectional view of a wiring board according to a second embodiment of the invention.
Figure 21:
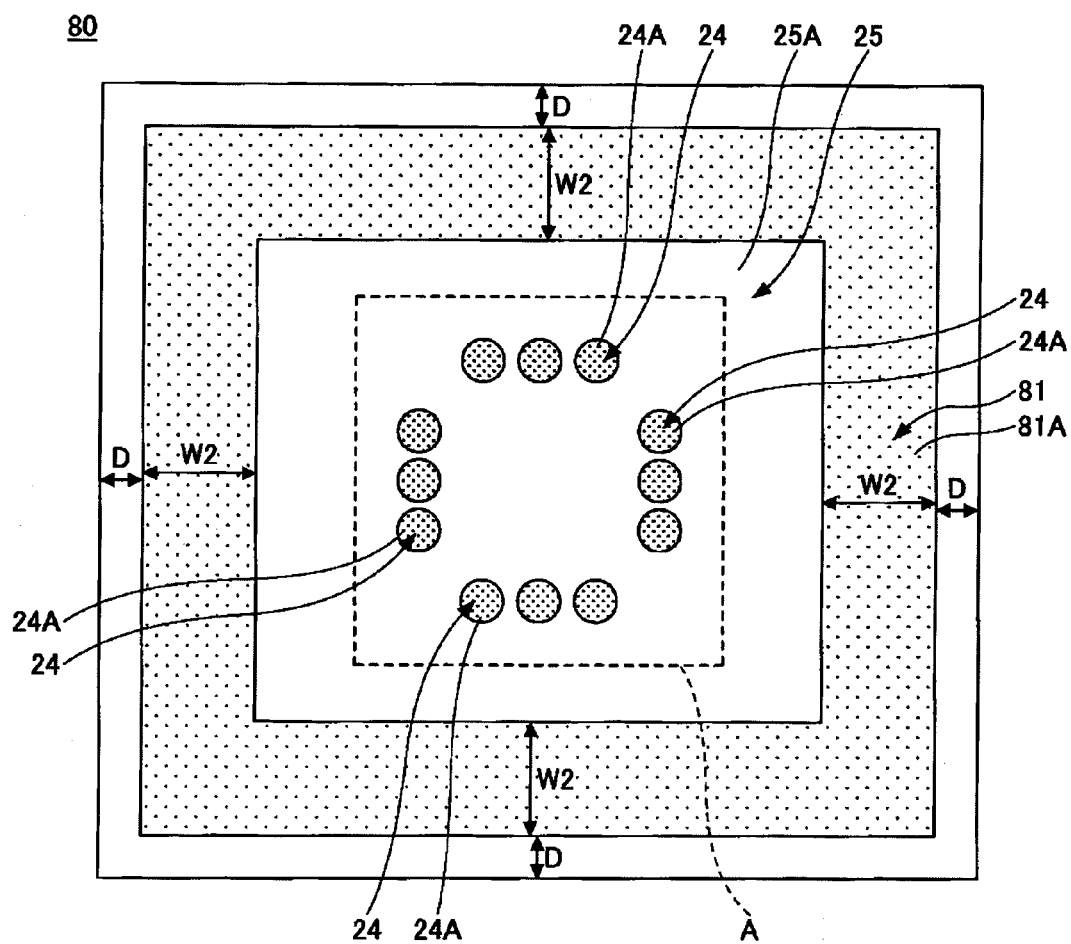
FIG. 21 is a plan view of the wiring board as shown in FIG. 20.

FIG. 20 is a cross-sectional view of a wiring board according to a second embodiment of the invention, and FIG. 21 is a plan view of the wiring board as shown in FIG. 20. In FIGS. 20 and 21, the same or like parts are designated by the same reference numerals or signs as the wiring board 10 of the first embodiment.

Referring to FIGS. 20 and 21, the wiring board 80 according to the second embodiment is the same as the wiring board 10, except that a warp reduction member 81 is provided instead of the warp reduction member 22 provided in the wiring board 10 of the first embodiment.

The warp reduction member 81 is the member for reducing a warp of the wiring board main body 21, and disposed internally on the side of the surface 25A of the dielectric layer 25. A surface 81A of the warp reduction member 81 located on the side where the electronic component 11 is disposed is configured to be almost flush with the surface 24A of the electronic component attaching pad 24 and the surface 25A of the dielectric layer 25.

In this manner, since the warp reduction member 81 for reducing the warp of the wiring board main body 21 is disposed inside the dielectric layer 25, and the surface 81A of the warp reduction member 81 located on the side where the electronic component 11 is disposed is configured to be almost flush with the surface 24A of the electronic component attaching pad 24 and the surface 25A of the dielectric layer 25, the warp of the wiring board main body 21 can be reduced, and the size of the wiring board 80 in the thickness direction can be smaller (thinner) than the conventional wiring board 200 (see FIG. 1) having the stiffener 202. In other words, the warp of the wiring board main body 21 can be reduced without increasing the size of the wiring board main body 21.

The warp reduction member 81 has a frame shape in plan view. The outer shape of the warp reduction member 81 is configured to be smaller than the outer shape of the wiring board main body 21. The warp reduction member 81 is disposed on the dielectric layer 25 in a part located outside the electronic component attaching pad formation area A in which a plurality of electronic component attaching pads 24 are formed and spaced from the outer edge of the dielectric layer 25. If the outer shape of the wiring board main body 21 is 34 mm×34 mm, and the electronic component attaching pad formation area A is 10 mm×10 mm, the width W2 of the warp reduction member 81 can be 5.0 mm, for example. In this case, the distance D from the outer edge of the dielectric layer 25 to the warp reduction member 81 may be 0.5 mm, for example.

The warp reduction member 81 is disposed on the same plane as the electronic component attaching pad 24. Also, the thickness of the warp reduction member 81 is roughly equal to the thickness of the electronic component attaching pad 24, and the material of the warp reduction member 81 is substantially the same as the material of the electronic component attaching pad 24.

In this manner, since the warp reduction member 81 is disposed on the same plane as the electronic component attaching pad 24, the thickness of the warp reduction member 81 is roughly equal to the thickness of the electronic component attaching pad 24, and the material of the warp reduction member 81 is substantially the same as the material of the electronic component attaching pad 24, the electronic component attaching pad 24 and the warp reduction member 81 can be formed at the same time when forming the electronic component attaching pad 24.

The warp reduction member 81 may be a metal film, for example. The warp reduction member 81 may be an Au/Pd/Ni laminated film in which an Au layer (e.g., 0.05 μm thick), a Pd layer (e.g., 0.5 μm thick) and an Ni layer (e.g., 5.0 μm thick) are laminated in order from the side of the surface 25A of the dielectric layer 25, an Au/Pd/Ni/Cu laminated film, an Au/Ni laminated film, or an Au/Ni/Cu laminated film. Also, in the case where an Ni layer is used as one of the components of the warp reduction member 81, the film thickness of the Ni layer should be larger than the thickness of other layers. In this manner, if the film thickness of the Ni layer is made larger than the thickness of other layers, the warp of the wiring board main body 21 can be reduced. Also, in the case where a Cu layer that easily allows heavy deposition by plating is used as one of the components of the warp reduction member 81, the warp of the wiring board main body 21 can be reduced by increasing the thickness of the Cu layer.

In this manner, by using the metal film as the warp reduction member 81, the cost (including the manufacturing cost) of the warp reduction member 81 can be lower than the stiffener 202 (see FIG. 1) provided on the conventional wiring board 200, whereby the cost of the wiring board 80 can be reduced. Also, by using the metal film as the warp reduction member 81, the thickness of the warp reduction member 81 can be thinner. The thickness of the warp reduction member 81 may be from 5.0 μm to 15.0 μm, for example.

Also, since the lateral surface of the warp reduction member 81 with the above constitution is covered with the dielectric layer 25 (the lateral surface of the warp reduction member 81 is not exposed out of the lateral surface of the wiring board 80), a short-circuit between the outside of the wiring board 80 and the warp reduction member 81 can be prevented.

With the wiring board of this embodiment, the warp reduction member 81 for reducing the warp of the wiring board main body 21 is disposed inside the dielectric layer 25, and the surface 81A of the warp reduction member 81 located on the side where the electronic component 11 is disposed is configured to be almost flush with the surface 24A of the electronic component attaching pad 24 and the surface 25A of the dielectric layer 25, whereby the warp of the wiring board main body 21 can be reduced, and the size of the wiring board 80 in the thickness direction can be smaller than the conventional wiring board 200 (see FIG. 1) having the stiffener 202. In other words, the warp of the wiring board main body 21 can be reduced without increasing the size of the wiring board main body 21.

Also, by using the metal film as the warp reduction member 81, the cost (including the manufacturing cost) of the warp reduction member 81 can be lower than the stiffener 202 (see FIG. 1) provided on the conventional wiring board 200, whereby the cost of the wiring board 80 can be reduced.

It should be noted that the solder resist layer 53 as previously described and shown in FIG. 8 may be provided on the surface 25A of the dielectric layer 25 provided on the wiring board 80 according to this embodiment.

Figure 22:
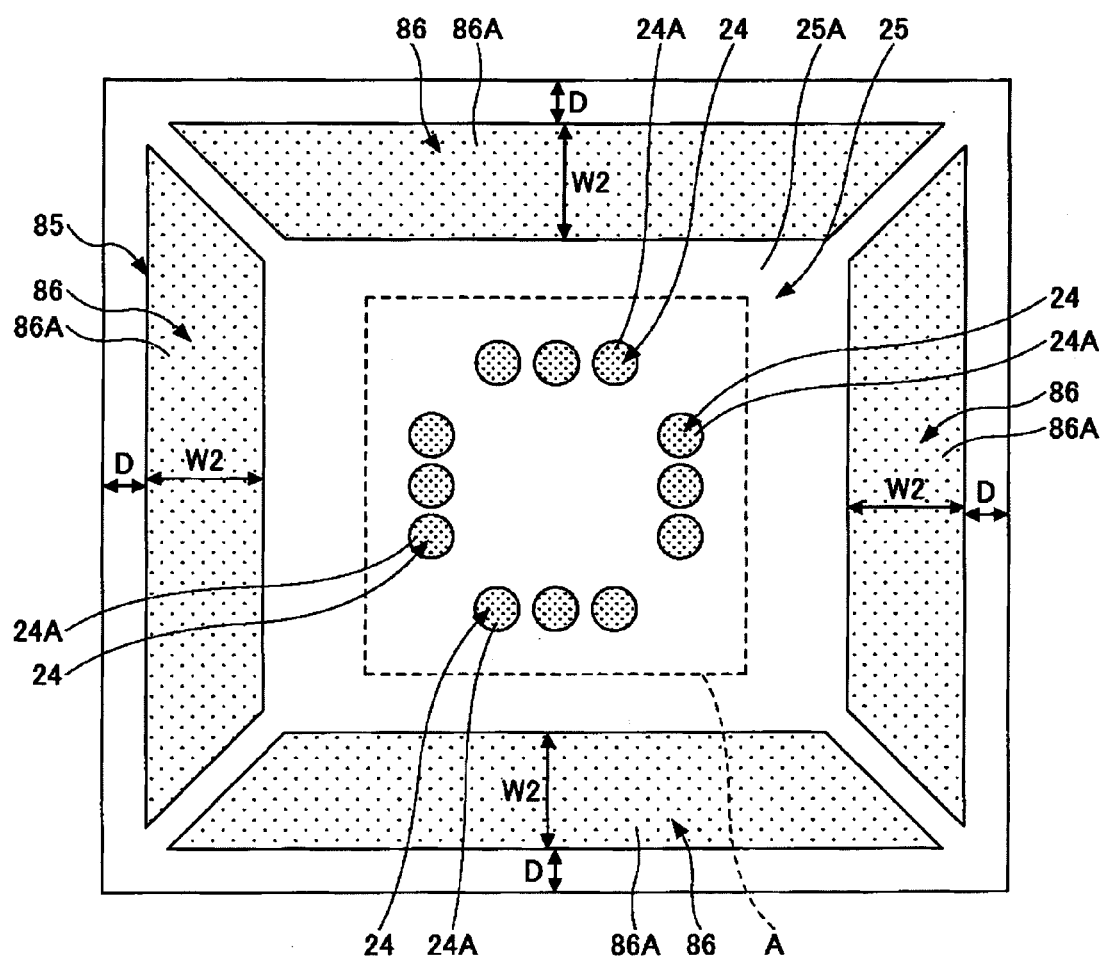
FIG. 22 is a plan view (No. 1) for explaining another warp reduction member.
Figure 23:
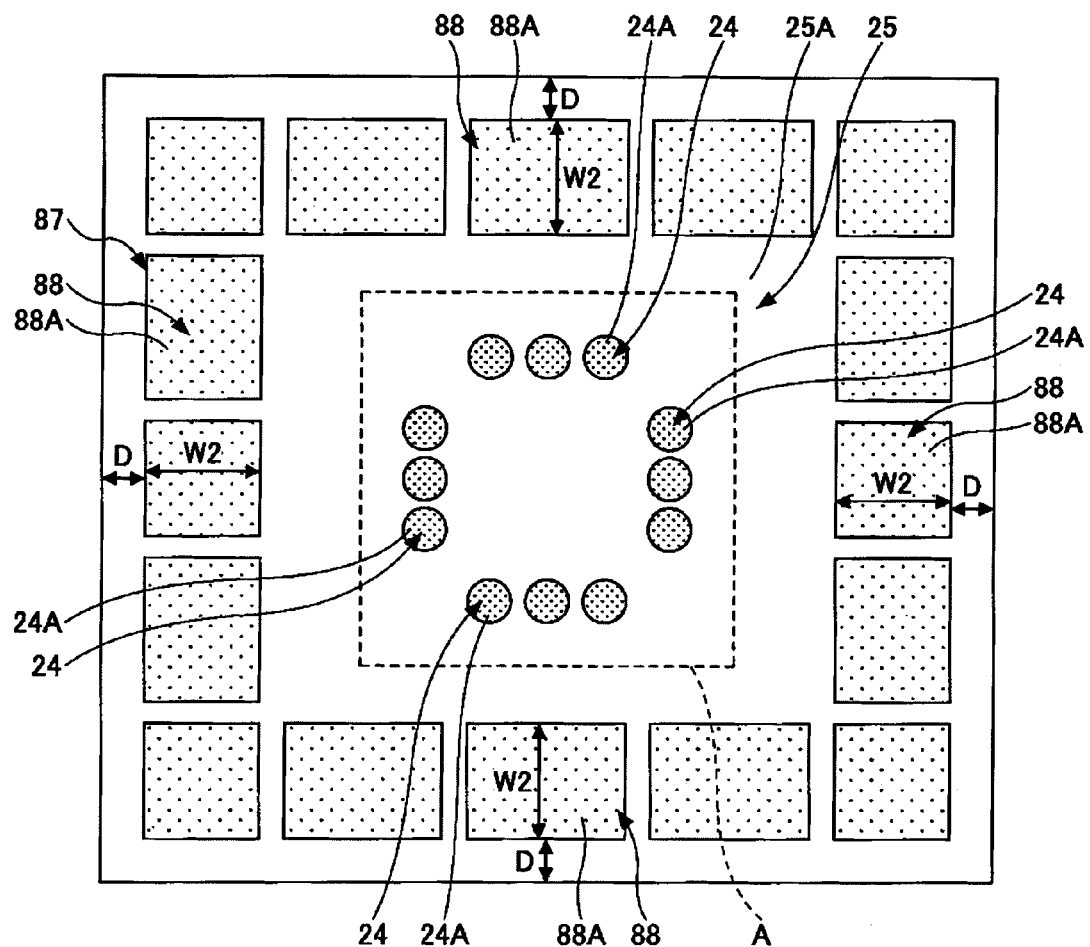
FIG. 23 is a plan view (No. 2) for explaining another warp reduction member.

FIGS. 22 and 23 are plan views for explaining the other warp reduction members. In FIGS. 22 and 23, the same or like parts are designated by the same reference numerals or signs as the wiring board 80 of the second embodiment.

Though the warp reduction member 81 having the frame shape in plan view is provided in the wiring board main body 21 in this embodiment, a warp reduction member 85 as shown in FIG. 22 or a warp reduction member 87 as shown in FIG. 23, as will be described later, may be provided instead of the warp reduction member 81.

Referring to FIG. 22, the warp reduction member 85 is disposed inside the dielectric layer 25 in a part located outside the electronic component attaching pad formation area A in which a plurality of electronic component attaching pads 24 are formed and spaced from the outer edge of the dielectric layer 25. The warp reduction member 85 has a plurality of (four in this case) warp reduction portions 86. The warp reduction portions 86 are provided on the same plane as the electronic component attaching pad 24. The surface 86A of the warp reduction portion 86 is configured to be almost flush with the surface 24A of the electronic component attaching pad 24 and the surface 25A of the dielectric layer 25. The thickness of the warp reduction portion 86 is roughly equal to the thickness of the electronic component attaching pad 24, and the material of the warp reduction portion 86 is substantially the same as the material of the electronic component attaching pad 24. The plurality of warp reduction portions 86 are arranged at the positions spaced from each other.

In this manner, since the warp reduction member 85 having the plurality of (four in this case) warp reduction portions 86 arranged at positions spaced from each other is provided in the wiring board main body 21, the stress occurring within the wiring board main body 21 can be reduced.

Referring to FIG. 23, the warp reduction member 87 is disposed inside the dielectric layer 25 in a part located outside the electronic component attaching pad formation area A in which a plurality of electronic component attaching pads 24 are formed and spaced from the outer edge of the dielectric layer 25. The warp reduction member 87 has a plurality of warp reduction portions 88 having a smaller area than the warp reduction portions 86 as shown in FIG. 22. The warp reduction portions 88 are provided on the same plane as the electronic component attaching pad 24. The surface 88A of the warp reduction portion 88 is configured to be almost flush with the surface 24A of the electronic component attaching pad 24 and the surface 25A of the dielectric layer 25. The thickness of the warp reduction portion 88 is roughly equal to the thickness of the electronic component attaching pad 24, and the material of the warp reduction portion 88 is substantially the same as the material of the electronic component attaching pad 24. The plurality of warp reduction portions 88 are arranged at the positions spaced from each other.

In the case where the warp reduction member 87 with this constitution is provided in the wiring board main body 21, the stress occurring within the wiring board main body 21 can be also reduced.

FIGS. 24 to 28 are views showing a manufacturing process for the wiring board according to the second embodiment of the invention. In FIGS. 24 to 28, the same or like parts are designated by the same reference numerals or signs as the wiring board 80 of the second embodiment.

Figure 24:
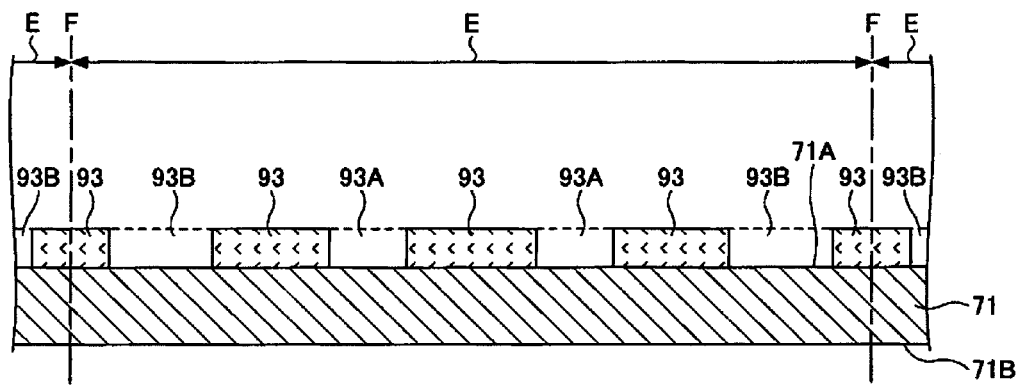
FIG. 24 is a view (No. 1) showing a manufacturing process for a wiring board according to a second embodiment of the invention.

Referring to FIGS. 24 to 28, a manufacturing method for the wiring board 80 according to the second embodiment will be described below. At first, in the process as shown in FIG. 24, a resist film 93 having the opening portions 93A and 93B is formed on the upper surface 71A of the carrier 71 having conductivity and a plurality of wiring board formation areas E formed with the wiring board 80. At this time, an opening portion 93A is formed to expose the upper surface 71A of the carrier 71 in a part corresponding to the formation area of the electronic component attaching pad 24. Also, an opening portion 93B is formed to expose the upper surface 71A of the carrier 71 in a part corresponding to the formation area of the warp reduction member 81. As the carrier 71 having conductivity, a metal plate (e.g., Cu plate) or a metal foil (e.g., Cu foil) may be used.

Figure 25:
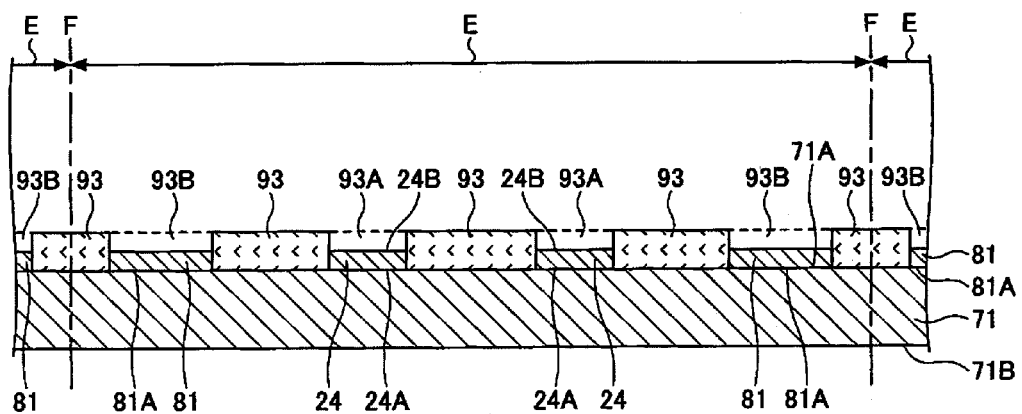
FIG. 25 is a view (No. 2) showing the manufacturing process for the wiring board according to the second embodiment of the invention.

Next, in the process as shown in FIG. 25, by plating, the electronic component attaching pad 24 is formed on the upper surface 71A of the carrier 71 in a part exposed to the opening portion 93A, and the warp reduction member 81 is formed on the upper surface 71A of the carrier 71 in a part exposed to the opening portion 93B (formation process for electronic component attaching pad and warp reduction member). That is, by plating, the electronic component attaching pad 24 and the warp reduction member 81 are formed on the upper surface 71A of the carrier 71 at the same time. The warp reduction member 81 is disposed in the wiring board formation area E in a part located inside the cutting position F, and is separate from the warp reduction member 81 formed in another wiring board formation area E.

Figure 28:
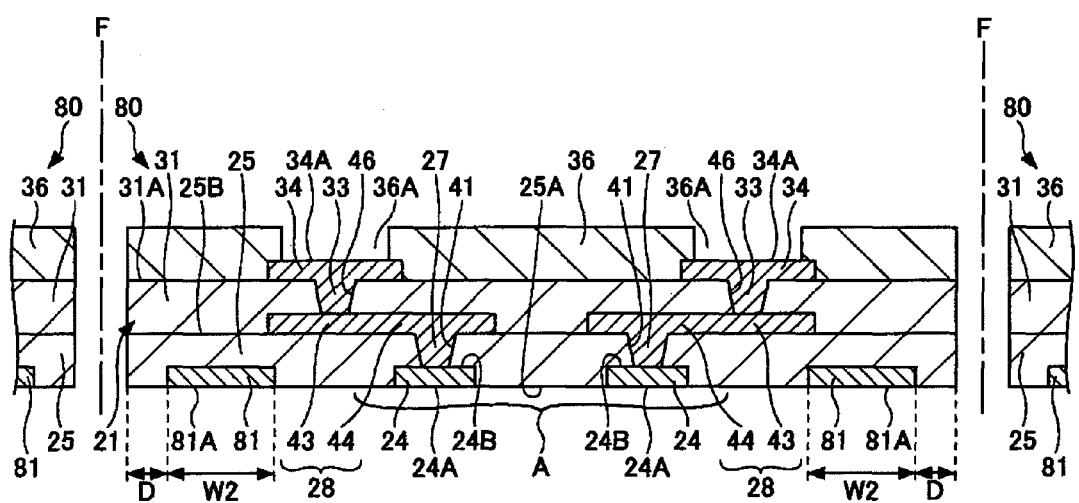
FIG. 28 is a view (No. 5) showing the manufacturing process for the wiring board according to the second embodiment of the invention.

In this manner, since the warp reduction member 81 is disposed in the wiring board formation area E in a part located inside the cutting position F, and formed such that the warp reduction members 81 formed in a plurality of wiring board formation areas E are separate from the other warp reduction members 81 formed in the other wiring board formation areas E, it is unnecessary to cut the metal film (warp reduction member 81) that is more difficult to cut than the dielectric layers 25 and 31 and the solder resist layer 36 in the process as shown in FIG. 28, as will be described later, whereby the productivity of the wiring board 80 can be improved.

The electronic component attaching pad 24 and the warp reduction member 81 may be made of an Au/Pd/Ni laminated film in which an Au layer (e.g., 0.05 μm thick), a Pd layer (e.g., 0.5 μm thick) and an Ni layer (e.g., 5.0 μm thick) are laminated in order, an Au/Pd/Ni/Cu laminated film, an Au/Ni laminated film or an Au/Ni/Cu laminated film. In the case where an Ni layer is used as one of the components of the electronic component attaching pad 24 and the warp reduction member 81, the film thickness of the Ni layer should be larger than the thickness of other layers. In this manner, if the film thickness of the Ni layer is made larger than the thickness of other layers, the warp of the wiring board main body 21 can be reduced. Also, in the case where a Cu layer that easily allows heavy deposition by plating is used as one of the components of the electronic component attaching pad 24 and the warp reduction member 81, the warp of the wiring board main body 21 can be reduced by increasing the thickness of the Cu layer.

In the case where the Au/Pd/Ni laminated film is used as the electronic component attaching pad 24 and the warp reduction member 81, an Au layer (e.g., 0.05 μm thick), a Pd layer (e.g., 0.5 μm thick) and an Ni layer (e.g., 5.0 μm thick) are deposited and grown in order on the upper surface 71A of the carrier 71 in a part exposed to the opening portions 93A and 93B by electrolytic plating with the carrier 71 having conductivity as a feed layer, whereby the electronic component attaching pad 24 and the warp reduction member 81 are formed at the same time.

In this manner, since the electronic component attaching pad 24 and the warp reduction member 81 are formed at the same time by plating, it is unnecessary to provide the process for forming the warp reduction member 81 separately, and prepare the material for making the warp reduction member 81 separately, whereby the cost (including the manufacturing cost) of the wiring board 80 having the warp reduction member 81 can be reduced.

Also, since the electronic component attaching pad 24 and the warp reduction member 81 are formed by plating, the thickness of the warp reduction member 81 can be thinner. The thickness of the warp reduction member 81 may be from 5.0 μm to 15.0 μm, for example.

Figure 26:
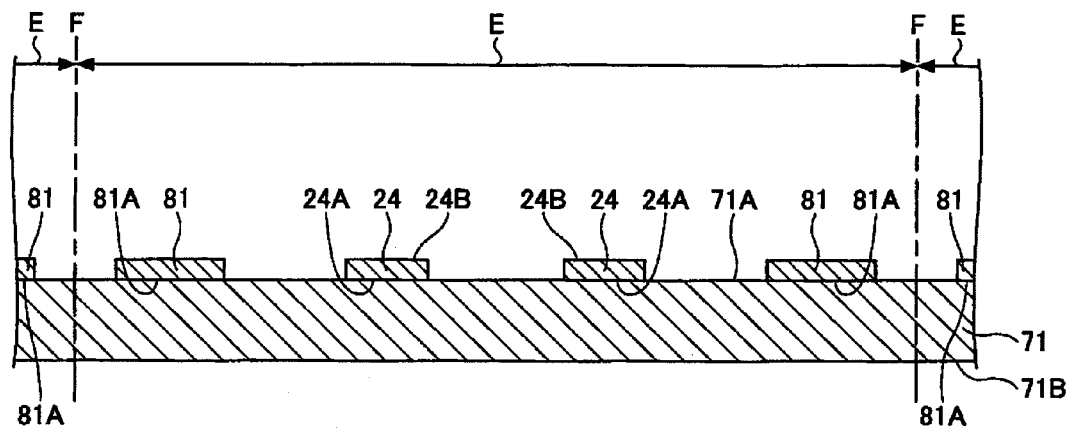
FIG. 26 is a view (No. 3) showing the manufacturing process for the wiring board according to the second embodiment of the invention.

Next, in the process as shown in FIG. 26, the resist film 93 is removed. Next, in the process as shown in FIG. 27, a structure (structure in which a plurality of wiring boards 80 are integrated) as shown in FIG. 27 is formed by performing the same process as previously described in the first embodiment and shown in FIGS. 14 to 18.

Figure 27:
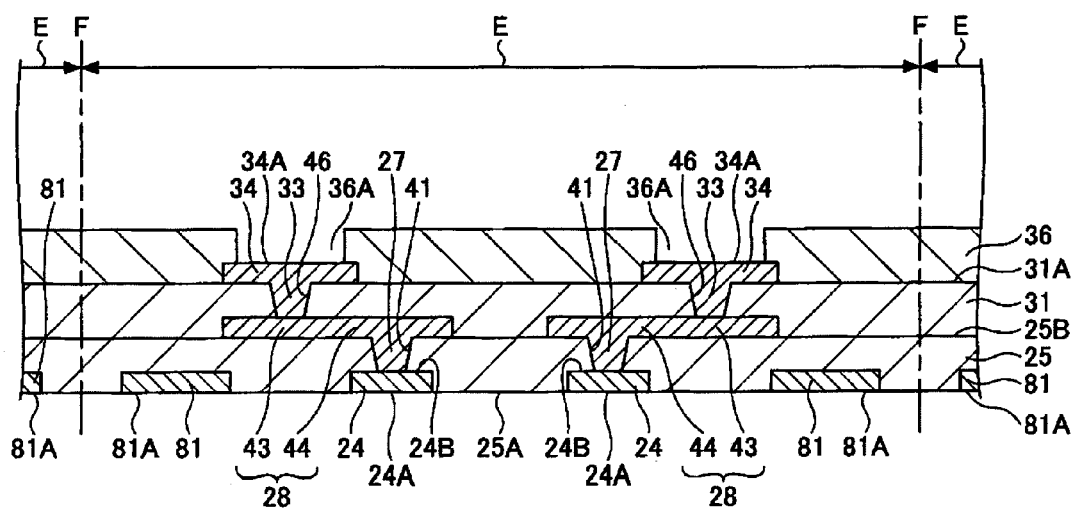
FIG. 27 is a view (No. 4) showing the manufacturing process for the wiring board according to the second embodiment of the invention.

Next, in the process as shown in FIG. 28, the structure as shown in FIG. 27 is cut along the cutting position F and individuated into the plurality of wiring boards 80, whereby the plurality of wiring boards 80 are manufactured.

With the manufacturing method for the wiring board according to this embodiment, the warp reduction member 81 is disposed on the dielectric layer 25 in a part located inside the cutting position F, and formed such that the warp reduction members 81 formed in the plurality of wiring board formation areas E are separate from the other warp reduction members 81 in the other wiring board formation areas E, it is necessary to cut only the dielectric layers 25 and 31 and the solder resist layer 36 that are easier to cut than the metal film (warp reduction member 81) in the process as shown in FIG. 28, whereby the productivity of the wiring board 80 can be improved.

The manufacturing method for the wiring board 80 of this embodiment can achieve the same effects as the manufacturing method for the wiring board 10 according to the first embodiment.

Though the preferred embodiments of the invention are described above in detail, the invention is not limited to those specific embodiments, but various variations or modifications may be made without departing from spirit or scope of the invention as defined in the claims.

The invention is applicable to the wiring board and its manufacturing method in which the warp of the wiring board main body can be reduced and the size of the wiring board in the thickness direction can be smaller.

What is claimed is:

1. A wiring board comprising:
a wiring board main body, including:
a first dielectric layer,
an electronic component attaching pad having a connection surface with which an electronic component is connected, and disposed inside the first dielectric layer to expose the connection surface,
at least one second dielectric layer laminated on the first dielectric layer,
a via hole, and a wiring pattern provided on the first dielectric layer and the at least one second dielectric layer, and electrically connected with the electronic component attaching pad, and
a warp reduction member for reducing a warp of the wiring board main body, disposed inside the first dielectric layer, a surface of the warp reduction member located on the side of the connection surface of the electronic component attaching pad being flush with one surface of the first dielectric layer.

2. The wiring board according to claim 1, wherein
the connection surface of the electronic component attaching pad is almost flush with one surface of the first dielectric layer.

3. The wiring board according to claim 2, wherein
the warp reduction member is disposed on the same plane as the electronic component attaching pad,
the thickness of the warp reduction member is almost equal to the thickness of the electronic component attaching pad, and
the material of the warp reduction member is substantially the same as the material of the electronic component attaching pad.

4. The wiring board according to claim 1, wherein the warp reduction member is a metal film.

5. The wiring board according to claim 1, wherein
the warp reduction member is disposed on the first dielectric layer located outside a part corresponding to a formation area of the electronic component attaching pad, and
the warp reduction member has a frame shape in plan view.

6. The wiring board according to claim 1, wherein
the warp reduction member has a plurality of warp reduction portions, and
the plurality of warp reduction portions are spaced from each other.

7. The wiring board according to claim 1, further comprising:
a solder resist layer exposing the connection surface of the electronic component attaching pad, and covering the surface of the warp reduction member located on the side of the connection surface of the electronic component attaching pad on one surface of the first dielectric layer.

* * * * *